(12) United States Patent
Kobayashi et al.

(10) Patent No.: US 7,781,798 B2
(45) Date of Patent: Aug. 24, 2010

(54) SOLID-STATE IMAGE PICKUP DEVICE AND FABRICATION METHOD THEREFOR

(75) Inventors: Yusaku Kobayashi, Kanagawa (JP); Koji Watanabe, Kanagawa (JP); Toshihiko Hayashi, Kanaagawa (JP)

(73) Assignee: Sony Corporation, Tokyo (JP)

( * ) Notice: Subject to any disclaimer, the term of this patent is extended or adjusted under 35 U.S.C. 154(b) by 11 days.

(21) Appl. No.: 12/334,229

(22) Filed: Dec. 12, 2008

(65) Prior Publication Data
US 2009/0184386 A1  Jul. 23, 2009

(30) Foreign Application Priority Data

Jan. 17, 2008  (JP)  ............................. 2008-007730
Sep. 10, 2008  (JP)  ............................. 2008-231782

(51) Int. Cl.
*H01L 31/0328* (2006.01)

(52) U.S. Cl. ........................ 257/184; 257/225; 257/231; 257/258; 257/291; 257/E31.058

(58) Field of Classification Search ................. 257/184, 257/225, 231, 258, 291
See application file for complete search history.

(56) References Cited

U.S. PATENT DOCUMENTS

| | | | |
|---|---|---|---|
| 6,472,698 B1 * | 10/2002 | Nakashiba | 257/222 |
| 6,861,686 B2 * | 3/2005 | Lee et al. | 257/291 |
| 2003/0214595 A1 * | 11/2003 | Mabuchi | 348/294 |

FOREIGN PATENT DOCUMENTS

JP  2006-294991  10/2006

* cited by examiner

*Primary Examiner*—Wai-Sing Louie
(74) *Attorney, Agent, or Firm*—Robert J. Depke; Rockey, Depke & Lyons

(57) ABSTRACT

Disclosed herein is a solid-state image pickup device, including, a light receiving pixel section, a black level reference pixel section, a multi-layer wiring line section, a first light blocking film, a second light blocking film, a third light blocking film, and a fourth light blocking layer.

7 Claims, 15 Drawing Sheets

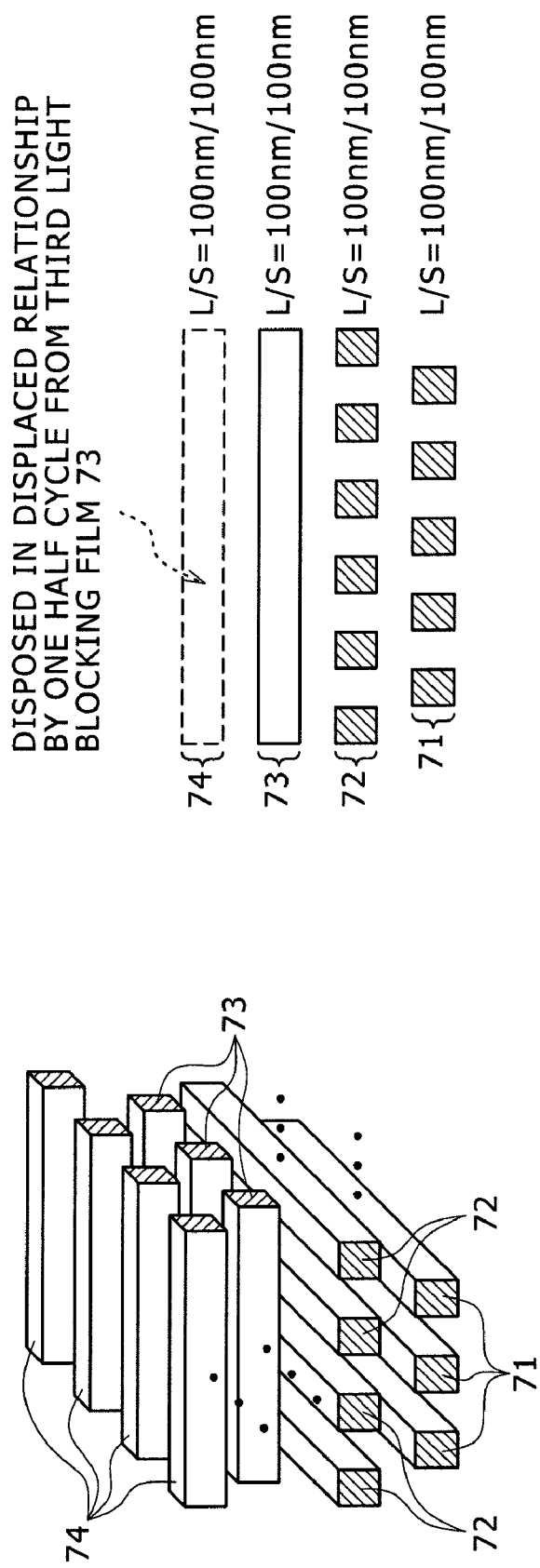

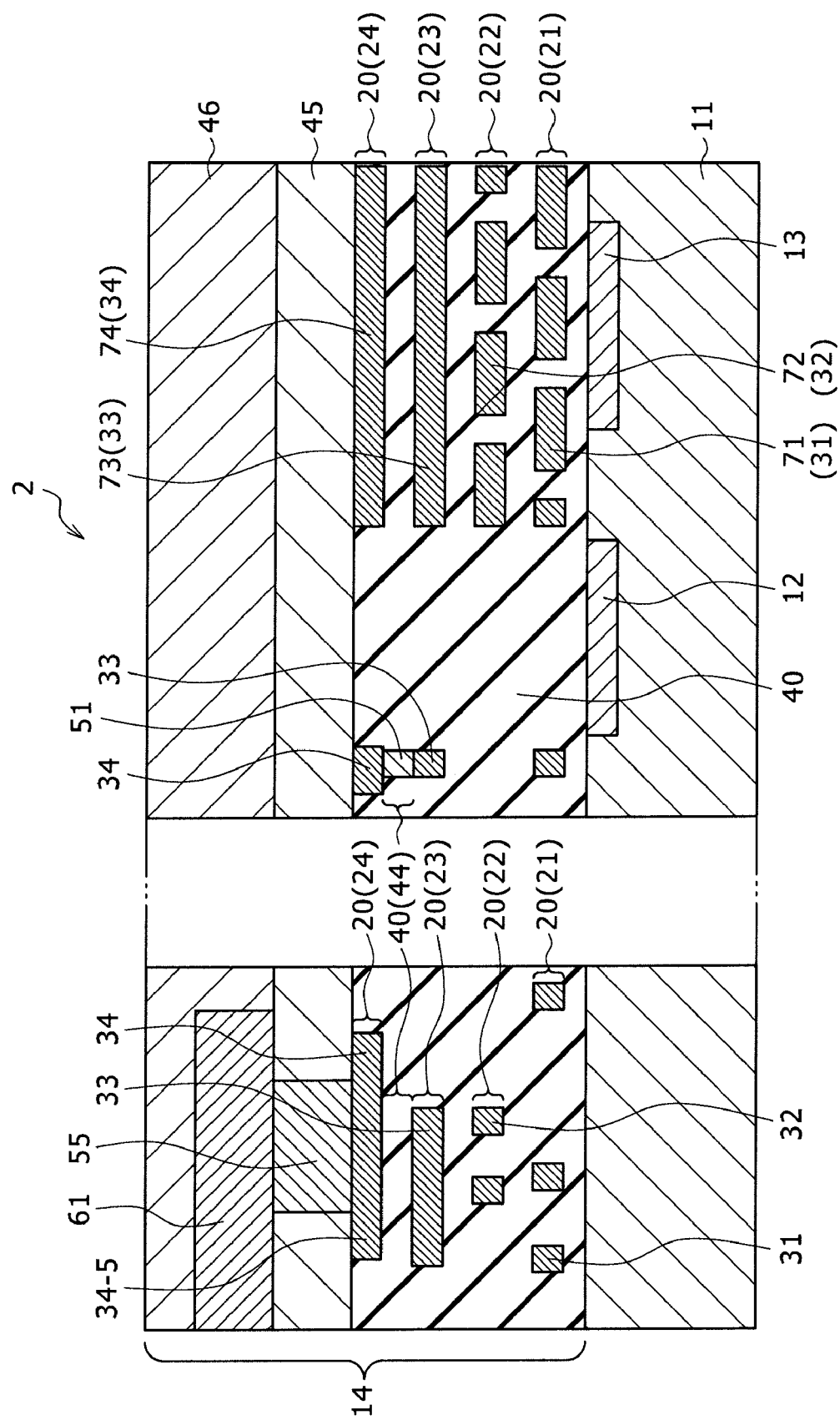

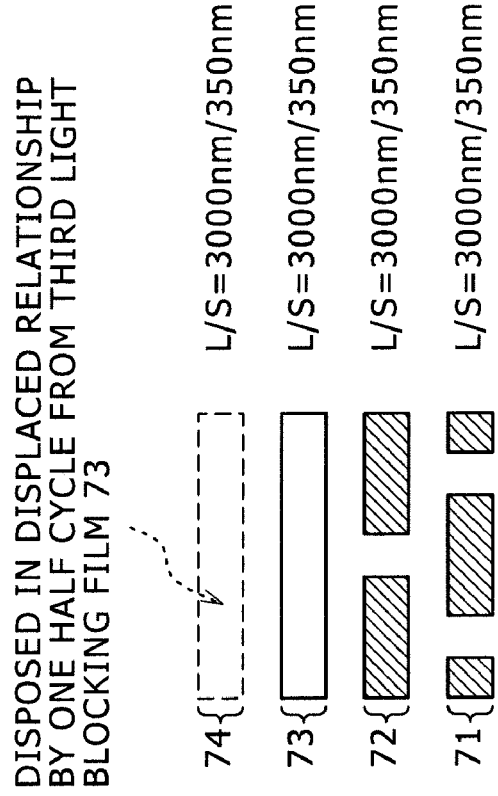
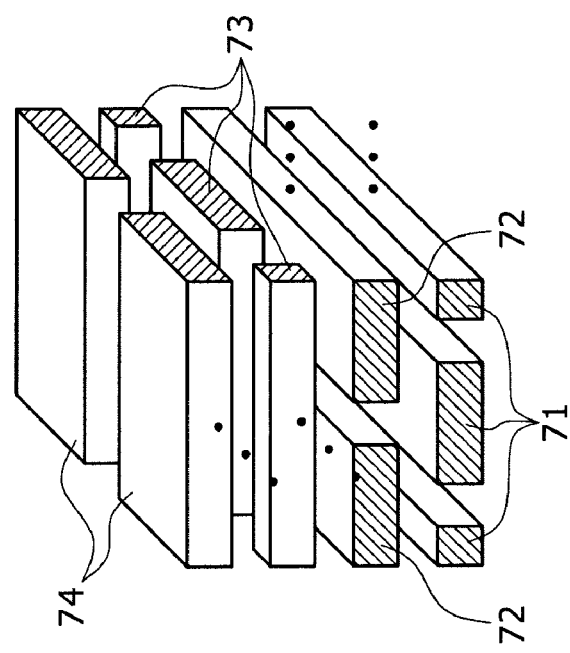

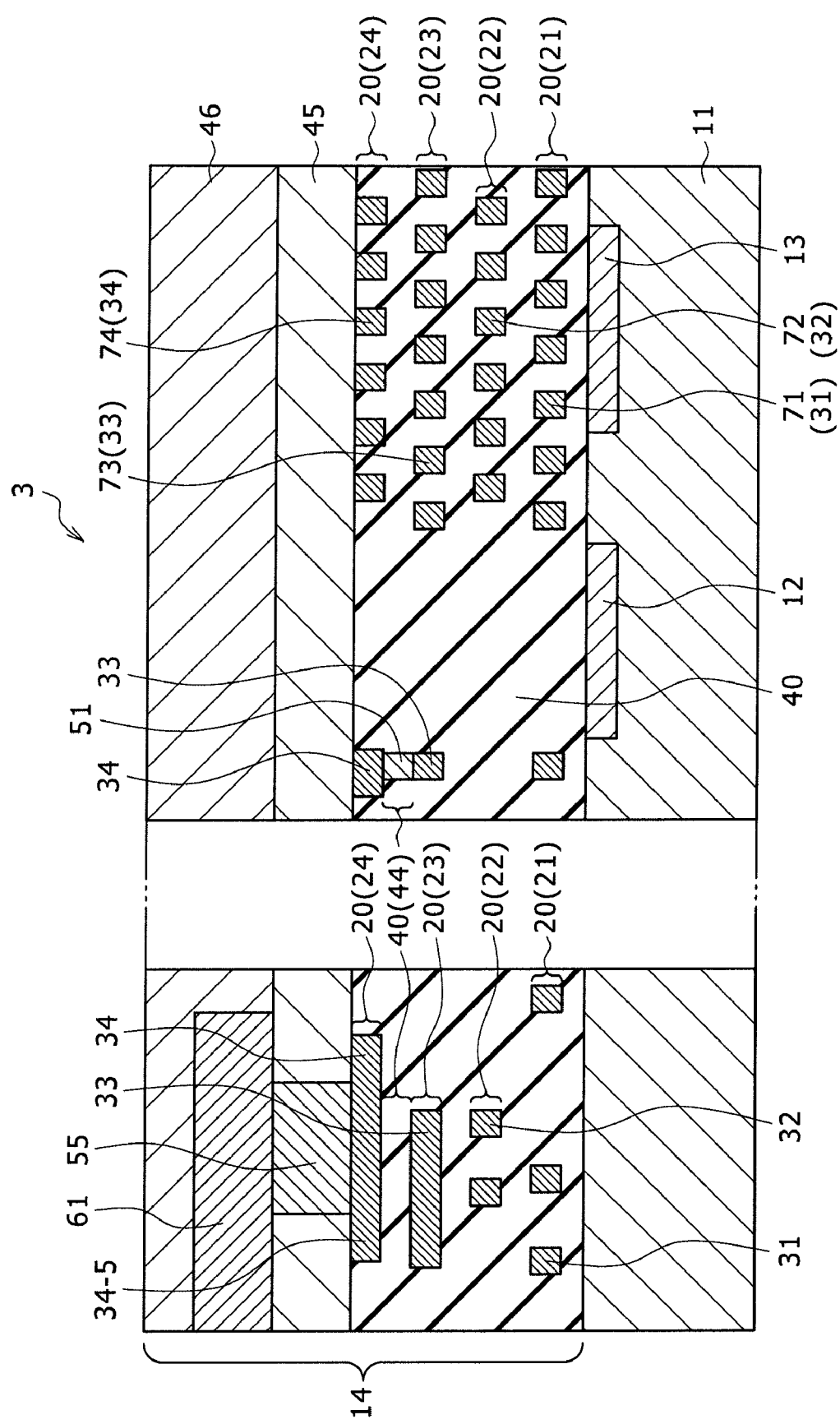

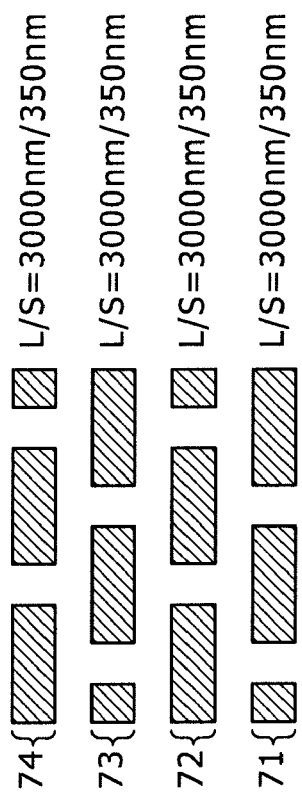
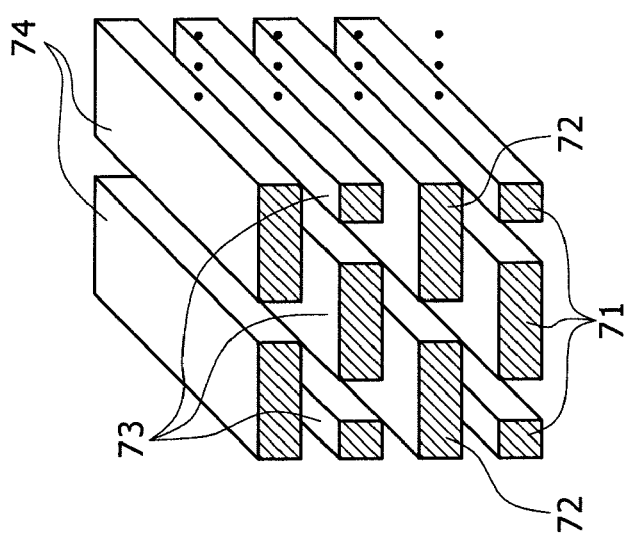
FIG. 10B
FIG. 10A

134(134a)

NO THIRD METAL WIRING LINE

NO SECOND METAL WIRING LINE

NO FIRST METAL WIRING LINE

134(134b)

NO THIRD METAL WIRING LINE

NO SECOND METAL WIRING LINE

NO FIRST METAL WIRING LINE

SOLID-STATE IMAGE PICKUP DEVICE AND FABRICATION METHOD THEREFOR

CROSS REFERENCES TO RELATED APPLICATIONS

The present invention contains subject matter related to Japanese Patent Applications JP 2008-231782 and 2008-007730 filed in the Japan Patent Office on Sep. 10, 2008 and Jan. 17, 2008, the entire contents of which being incorporated herein by reference.

BACKGROUND OF THE INVENTION

1. Field of the Invention

This invention relates to a solid-state image pickup device and a fabrication method therefor.

2. Description of the Related Art

In a solid-state image pickup device of the CMOS (Complementary Metal Oxide Semiconductor) type which is one of an image sensor, a region into which light should not be admitted, for example, a region of a black level reference pixel section configured to define the block color to be used as a color reference or a peripheral circuit, is normally shielded from light using a metal wiring line or an optical filter. For example, as a light blocking film formed from a metal wiring line, a wiring having a great line width of several tens to 100 μm is disposed on the uppermost layer above the black level reference pixel section so as to implement a light blocking function.

An example of a light blocking film for a black level reference pixel section which is formed at a copper wiring step or an aluminum wiring step for a multilayer wiring line section is described with reference to FIG. 15 which is a schematic sectional view of a CMOS image sensor in related art and FIGS. 16A and 16B which show a perspective view and a sectional view of part of a light blocking film of the CMOS image sensor of FIG. 15.

Referring to FIG. 15 and FIGS. 16A and 16B, the CMOS image sensor in related art shown includes a light receiving pixel section 112 and a black level reference pixel section 113 each formed from a photodiode on a semiconductor substrate 111, and a multilayer wiring line section 114 formed on an upper face of the light receiving pixel section 112 and the black level reference pixel section 113. The CMOS image sensor is disclosed, for example, in Japanese Patent Laid-Open No. 2006-294991.

The multilayer wiring line section 114 includes a plurality of metal wiring lines 130 formed in a piled relationship in the thicknesswise direction of the multilayer wiring line section 114 from the semiconductor substrate 111 side and including, for example, metal wiring lines 131, 132, 133 and 134, and a interlayer insulating film 140 for isolating the metal wiring lines 130 from one another.

A contact plug 151 is formed in the interlayer insulating film 140 (143) between one of the metal wiring lines 130, for example, the metal wiring line 134, and another one of the metal wiring lines 130 in a lower layer of the metal wiring line 134, for example, the metal wiring line 133. The contact plug 151 connects the metal wiring line 134 and the metal wiring line 133 in the lower layer with respect to the metal wiring line 134 through the interlayer insulating film 143.

Further, an interlayer insulating film 145 is formed in such a manner as to cover over an upper face of that one of the metal wiring lines 130 which is positioned in the uppermost layer, that is, the metal wiring line 134. A pad 161 is formed, for example, from aluminum (Al) on an upper face of the interlayer insulating film 145 and used for electric connection to a peripheral circuit (not shown) or the like.

Meanwhile, a contact plug 152 is formed, for example, from aluminum (Al) in the interlayer insulating film 145 between the pad 161 and the metal wiring line 134 (134c) positioned just below the pad 161. The contact plug 152 extends through the interlayer insulating film 145 to connect the pad 161 and the metal wiring line 134c to each other.

Further, the metal wiring line 134 (134a) is formed in an opposing relationship to the photodiode of the black level reference pixel section 113 and serves as a light blocking film for blocking incidence of light to the photodiode region of the black level reference pixel section 113.

The light blocking film in related art is structured such that a wiring line (metal wiring line 134a) of a great width of several tens to 100 μm is positioned only in the uppermost layer of the wiring line layer while a wiring line pattern is not disposed in the other wiring line layers.

Together with refinement of wiring lines by high integration of LSIs, also reduction of the film thickness of wiring lines is advancing, and in a proposal by an ITRS roadmap in 2005, while the wiring line film thickness of an intermediate layer in LSIs in the 90 nm generation is 225 nm, the wiring line film thickness of an intermediate layer in LSIs in the 65 nm generation is 170 nm.

As enhancement of integration of LSIs advances, also reduction in thickness of the light blocking film itself advances. For example, it is known that, while the light blocking film wherein the wiring line film thickness of an intermediate layer in LSIs in the 90 nm generation proposed by the ITRS roadmap in 2005 is 225 nm exhibits a transmittance of approximately −130 dB, the light blocking film wherein the wiring line film thickness of an intermediate layer in LSIs in the 65 nm generation exhibits another transmittance of approximately −90 dB and exhibits a deteriorated light blocking performance.

Further, in order to reduce the wiring line resistance, copper (Cu) wiring lines have been adopted since the 90 nm generation. Copper wiring line working involves a copper wiring line flattening step by chemical-mechanical polishing (CMP). In the CMP, since the film thickness of a large-width copper (Cu) wiring line is reduced by dishing or erosion, if such wiring line is used as a light blocking film, the light blocking performance is deteriorated.

SUMMARY OF THE INVENTION

In short, as enhancement of integration of LSIs advances, also reduction of the film thickness of the light blocking film itself advances and the light blocking performance is deteriorated. Further, since the film thickness of the light blocking film is reduced by dishing or erosion of CMP used for wiring line working, the light blocking performance is deteriorated.

Therefore, it is desirable to provide a solid-state image pickup device wherein a light blocking film is less likely to be influenced by dishing or erosion and is ready for LSIs in the future generations and a fabrication method for the solid-state image pickup device.

According to an embodiment of the present invention, there is provided a solid-state image pickup device or first solid-state image pickup device including a light receiving pixel section formed on a semiconductor substrate, a black level reference pixel section formed on the semiconductor substrate, and a multi-layer wiring line section formed on the semiconductor substrate including the light receiving pixel section and the black level reference pixel section, the multi-layer wiring line section including an insulating layer formed on the semiconductor substrate, and a plurality of metal wiring line layers formed in the insulating layer and including first, second, third and fourth metal wiring line layers, the solid-state image pickup device further including a first light blocking film formed by disposing some of a plurality of first metal wiring lines formed from the first metal wiring line layer in a predetermined spaced relationship from each other and in a plurality of rows above the black level reference pixel section, a second light blocking film formed by disposing some of a plurality of second metal wiring lines formed from the second metal wiring line layer above the first metal wiring line layer between and above the first metal wiring lines above the black level reference pixel section, a third light blocking film formed by disposing some of a plurality of third metal wiring lines formed from the third metal wiring line layer above the second metal wiring line layer in a predetermined spaced relationship from each other and in a plurality of rows in a direction perpendicular to the second light blocking film above the black level reference pixel section, and a fourth light blocking layer formed by disposing some of a plurality of fourth metal wiring lines formed from the fourth metal wiring line layer above the third metal wiring line layer above and between the third metal wiring lines above the black level reference pixel section.

Since the solid-state image pickup device or first solid-state image pickup device includes the first light blocking film formed by disposing some of the first metal wiring lines formed from the first metal wiring line layer from among the metal wiring line layers in a predetermined spaced relationship from each other and in a plurality of rows above the black level reference pixel section and the second light blocking film formed by disposing some of the second metal wiring lines formed from the second metal wiring line layer above the first metal wiring line layer between and above the first metal wiring lines above the black level reference pixel section, the black level reference pixel section is covered with the first and second light blocking films as viewed in plan. Further, since the first solid-state image pickup device further includes the third light blocking film formed by disposing some of the third metal wiring lines formed from the third metal wiring line layer above the second metal wiring line layer in a predetermined spaced relationship from each other and in a plurality of rows in a direction perpendicular to the second light blocking film above the black level reference pixel section and the fourth light blocking layer formed by disposing some of the fourth metal wiring lines formed from the fourth metal wiring line layer above the third metal wiring line layer above and between the third metal wiring lines above the black level reference pixel section, the black level reference pixel section is covered with the third and fourth light blocking films as viewed in plan.

Besides, since the third and fourth light blocking films are disposed in a direction perpendicular to the first and second light blocking films, the light blocking property against oblique incident light is enhanced, and a light blocking layer is formed from substantially two metal wiring line layers. Accordingly, the total film thickness of the light blocking film can be increased in comparison with a light blocking film in related art formed from a single metal wiring line layer.

Consequently, even if the metal wiring line layers are formed from a reduced thickness layer, the light blocking film has a light blocking property ready for LSIs in the future generations.

Further, since the first metal wiring lines of the first light blocking film are disposed in a predetermined spaced relationship from each other and in a plurality of rows, they can be formed with a line width with which dishing or erosion does not occur. Similarly, also the metal wiring lines of the second, third and fourth light blocking films can be formed with a line width with which dishing or erosion does not occur.

Accordingly, since the light blocking films can assure a predetermined film thickness, deterioration of the light blocking performance can be prevented.

In summary, the first solid-state image pickup device is advantageous in that, since the light blocking property against oblique incident light is enhanced and a light blocking film is formed from substantially two metal wiring line layers, even if the thickness of the wiring lines reduces by refinement, the light blocking property of the light blocking films formed from films in the layers same as those of the wiring lines and the light blocking film has a light blocking property ready for LSIs in the future generations.

Further, since the metal wiring lines are formed with a width with which dishing or erosion does not occur, even if chemical-mechanism polishing is used for formation of the light blocking films, the film thickness of the light blocking films can be assured to a film thickness as designed, and consequently, deterioration of the light blocking property can be prevented.

According to another embodiment of the present invention, there is provided a solid-state image pickup device or second solid-state image pickup device including a light receiving pixel section formed on a semiconductor substrate, a black level reference pixel section formed on the semiconductor substrate, and a multi-layer wiring line section formed on the semiconductor substrate including the light receiving pixel section and the black level reference pixel section, the multi-layer wiring line section including an insulating layer formed on the semiconductor substrate, and a plurality of metal wiring line layers formed in the insulating layer and including first and second metal wiring line layers, the solid-state image pickup device further including a first light blocking film formed by disposing some of a plurality of first metal wiring lines formed from the first metal wiring line layer in a predetermined spaced relationship from each other and in a plurality of rows above the black level reference pixel section, and a second light blocking film formed by disposing some of a plurality of second metal wiring lines formed from the second metal wiring line layer above the first metal wiring line layer in a region including a region between and above the first metal wiring lines above the black level reference pixel section, the set of the first and second light blocking films being provided in a plurality of layers above the black level reference pixel section.

Since the solid-state image pickup device or second solid-state image pickup device includes the first light blocking film formed by disposing some of the first metal wiring lines formed from the first metal wiring line layer from among the metal wiring line layers in a predetermined spaced relationship from each other and in a plurality of rows above the black level reference pixel section and the second light blocking film formed by disposing some of the second metal wiring lines formed from the second metal wiring line layer above the first metal wiring line layer between and above the first metal wiring lines above the black level reference pixel section, the black level reference pixel section is covered with the first and second light blocking films as viewed in plan.

Besides, since a plurality of sets of the first and second light blocking films are provided above the black level reference pixel section, the light blocking property against oblique incident light is enhanced, and where at least two sets of the first and second light blocking films are provided, the light blocking film is formed from substantially two metal wiring line layers. Accordingly, the total film thickness of the light blocking film can be increased in comparison with a light blocking film in related art formed from a single metal wiring line layer. Naturally, where three or more sets of the first and second light blocking films are provided, the light blocking performance is enhanced in response to the number of the sets.

Consequently, even if the metal wiring line layers are formed from a reduced thickness layer, the light blocking film has a light blocking property ready for LSIs in the future generations.

Further, since the first metal wiring lines of the first light blocking film are disposed in a predetermined spaced relationship from each other and in a plurality of rows, they can be formed with a line width with which dishing or erosion does not occur. Similarly, since also the metal wiring lines of the second light blocking film are disposed between and above the first metal wiring lines, they are formed in a predetermined spaced relationship from each other in a plurality of rows. Therefore, the second metal wiring lines can be formed with a line width with which dishing or erosion does not occur similarly to the first metal wiring lines of the first light blocking film.

Accordingly, since the light blocking films can assure a predetermined film thickness, deterioration of the light blocking performance can be prevented.

In summary, the second solid-state image pickup device is advantageous in that, since the light blocking film is formed from substantially two metal wiring line layers, even if the thickness of the wiring lines reduces by refinement, the light blocking property of the light blocking films formed from films in the layers same as those of the wiring lines and the light blocking film has a light blocking property ready for LSIs in the future generations.

Further, since the metal wiring lines are formed with a width with which dishing or erosion does not occur, even if chemical-mechanism polishing is used for formation of the light blocking films, the film thickness of the light blocking films can be assured to a film thickness as designed, and consequently, deterioration of the light blocking property can be prevented.

According to a further embodiment of the present invention, there is provided a fabrication method or first fabrication method for a solid-state image pickup device including a light receiving pixel section formed on a semiconductor substrate, a black level reference pixel section formed on the semiconductor substrate, and a multi-layer wiring line section formed on the semiconductor substrate including the light receiving pixel section and the black level reference pixel section, the multi-layer wiring line section including an insulating layer formed on the semiconductor substrate and a plurality of metal wiring line layers formed in the insulating layer and including first, second, third and fourth metal wiring line layers, including the steps of disposing, when a plurality of first metal wiring lines are formed from the first metal wiring line layer, some of the first metal wiring lines in a predetermined spaced relationship from each other and in a plurality of rows above the black level reference pixel section to form a first light blocking film, disposing, when a plurality of second metal wiring lines are formed from the second metal wiring line layer above the first metal wiring line layer, some of the second metal wiring lines between and above the first metal wiring lines above the black level reference pixel section to form a second light blocking film, disposing, when a plurality of third metal wiring lines are formed from the third metal wiring line layer above the second metal wiring line layer, some of the third metal wiring lines in a predetermined spaced relationship from each other and in a plurality of rows in a direction perpendicular to the second light blocking film above the black level reference pixel section, and disposing, when a plurality of fourth metal wiring lines are formed from the fourth metal wiring line layer above the third metal wiring line layer, some of the fourth metal wiring lines between and above the third metal wiring lines above the black level reference pixel section to form a fourth light blocking film.

In the fabrication method or first fabrication method for a solid-state image pickup device, when a plurality of first metal wiring lines are formed from a first metal wiring line layer from among metal wiring line layers, some of the first metal wiring lines are disposed in a predetermined spaced relationship from each other and in a plurality of rows above a black level reference pixel section to form a first light blocking film. Then, when a plurality of second metal wiring lines are formed from the second metal wiring line layer above the first metal wiring line layer, some of the second metal wiring lines are disposed between and above the first metal wiring lines above the black level reference pixel section to form a second light blocking film. Therefore, the black level reference pixel section is covered with the first and second light blocking films as viewed in plan.

Further, when a plurality of third metal wiring lines are formed from the third metal wiring line layer above the second metal wiring line layer, some of the third metal wiring lines are disposed in a predetermined spaced relationship from each other and in a plurality of rows in a direction perpendicular to the second light blocking film above the black level reference pixel section. Then, when a plurality of fourth metal wiring lines are formed from the fourth metal wiring line layer above the third metal wiring line layer, some of the fourth metal wiring lines are disposed between and above the third metal wiring lines above the black level reference pixel section to form a fourth light blocking film. Therefore, the black level reference pixel section is covered with the third and fourth light blocking films as viewed in plan.

Besides, since the third and fourth light blocking films are formed in a direction perpendicular to the first and second light blocking films, the light blocking property against oblique incident light is enhanced, and a light blocking layer is formed from substantially two metal wiring line layers. Accordingly, the total film thickness of the light blocking film can be increased in comparison with a light blocking film in related art formed from a single metal wiring line layer.

Consequently, even if the metal wiring line layers are formed from a reduced thickness layer, the light blocking film has a light blocking property ready for LSIs in the future generations.

Further, since the first metal wiring lines of the first light blocking film are disposed in a predetermined spaced relationship from each other and in a plurality of rows, they can be formed with a line width with which dishing or erosion does not occur. Similarly, also the metal wiring lines of the second light blocking film can be formed with a line width with which dishing or erosion does not occur.

Accordingly, since the light blocking films can assure a predetermined film thickness, deterioration of the light blocking performance can be prevented.

In summary, the first fabrication method for a solid-state image pickup device is advantageous in that, even if the thickness of the wiring lines reduces by refinement, the light blocking property of the light blocking films formed from films in the layers same as those of the wiring lines and the light blocking film has a light blocking property ready for LSIs in the future generations. Further, the light blocking property against oblique incident light can be enhanced.

Further, since the light blocking films are formed with a width with which dishing or erosion does not occur, even if chemical-mechanism polishing is used for formation of the light blocking films, the film thickness of the light blocking films can be assured to a film thickness as designed, and consequently, deterioration of the light blocking property can be prevented.

According to a still further embodiment of the present invention, there is provided a fabrication method or second fabrication method for a solid-state image pickup device including a light receiving pixel section formed on a semiconductor substrate, a black level reference pixel section formed on the semiconductor substrate, and a multi-layer wiring line section formed on the semiconductor substrate including the light receiving pixel section and the black level reference pixel section, the multi-layer wiring line section including an insulating layer formed on the semiconductor substrate and a plurality of metal wiring line layers formed in the insulating layer and including first and second metal wiring line layers, including the steps of disposing, when a plurality of first metal wiring lines are formed from the first metal wiring line layer, some of the first metal wiring lines in a predetermined spaced relationship from each other and in a plurality of rows above the black level reference pixel section to form a first light blocking film, and disposing, when a plurality of second metal wiring lines are formed from the second metal wiring line layer above the first metal wiring line layer, some of the second metal wiring lines between and above the first metal wiring lines above the black level reference pixel section to form a second light blocking film, the set of the first and second light blocking films being provided in a plurality of layers above the black level reference pixel section.

In the fabrication method or second fabrication method for a solid-state image pickup device, when a plurality of first metal wiring lines are formed from a first metal wiring line layer from among metal wiring line layers, some of the first metal wiring lines are disposed in a predetermined spaced relationship from each other and in a plurality of rows above a black level reference pixel section to form a first light blocking film. Then, when a plurality of second metal wiring lines are formed from the second metal wiring line layer above the first metal wiring line layer, some of the second metal wiring lines are disposed between and above the first metal wiring lines above the black level reference pixel section to form a second light blocking film. Therefore, the black level reference pixel section is covered with the first and second light blocking films as viewed in plan.

Besides, since a set of the step of forming the first light blocking film and the step of forming the second light block film is carried out repetitively above the black light level reference pixel section, a light blocking layer is formed from substantially two metal wiring line layers. Accordingly, the total film thickness of the light blocking film can be increased in comparison with a light blocking film in related art formed from a single metal wiring line layer. Naturally, where three or more sets of the first and second light blocking films are provided, the light blocking performance is enhanced in response to the number of the sets.

Consequently, even if the metal wiring line layers are formed from a reduced thickness layer, the light blocking film has a light blocking property ready for LSIs in the future generations.

Further, since the first metal wiring lines of the first light blocking film are formed in a predetermined spaced relationship from each other and in a plurality of rows, they can be formed with a line width with which dishing or erosion does not occur. Similarly, since also the metal wiring lines of the second light blocking film are disposed between and above the first metal wiring lines, they are formed in a predetermined spaced relationship from each other in a plurality of rows. Therefore, the second metal wiring lines can be formed with a line width with which dishing or erosion does not occur similarly to the first metal wiring lines of the first light blocking film.

Accordingly, since the light blocking films can assure a predetermined film thickness, deterioration of the light blocking performance can be prevented.

In summary, the second fabrication method for a solid-state image pickup device is advantageous in that, even if the thickness of the wiring lines reduces by refinement, the light blocking property of the light blocking films formed from films in the layers same as those of the wiring lines and the light blocking film has a light blocking property ready for LSIs in the future generations.

Further, since the light blocking films are formed with a width with which dishing or erosion does not occur, even if chemical-mechanism polishing is used for formation of the light blocking films, the film thickness of the light blocking films can be assured to a film thickness as designed, and consequently, deterioration of the light blocking property can be prevented.

BRIEF DESCRIPTION OF THE DRAWINGS

FIGS. 2A and 2B illustrate a perspective view and a schematic sectional view of part of a light blocking film of the first solid-state image pickup device of FIG. 1;

FIG. 3 is a schematic sectional view showing a general configuration of a first solid-state image pickup device according to a second embodiment of the present invention;

FIGS. 4A and 4B illustrate a perspective view and a schematic sectional view of part of light blocking films of the first solid-state image pickup device of FIG. 3;

FIG. 7 is a schematic sectional view showing a general configuration of a second solid-state image pickup device according to a third embodiment of the present invention;

FIGS. 10A and 10B illustrate a perspective view and a schematic sectional view of part of a light blocking film of the second solid-state image pickup device of FIG. 9;

DETAILED DESCRIPTION OF THE PREFERRED EMBODIMENTS

Figure 1:
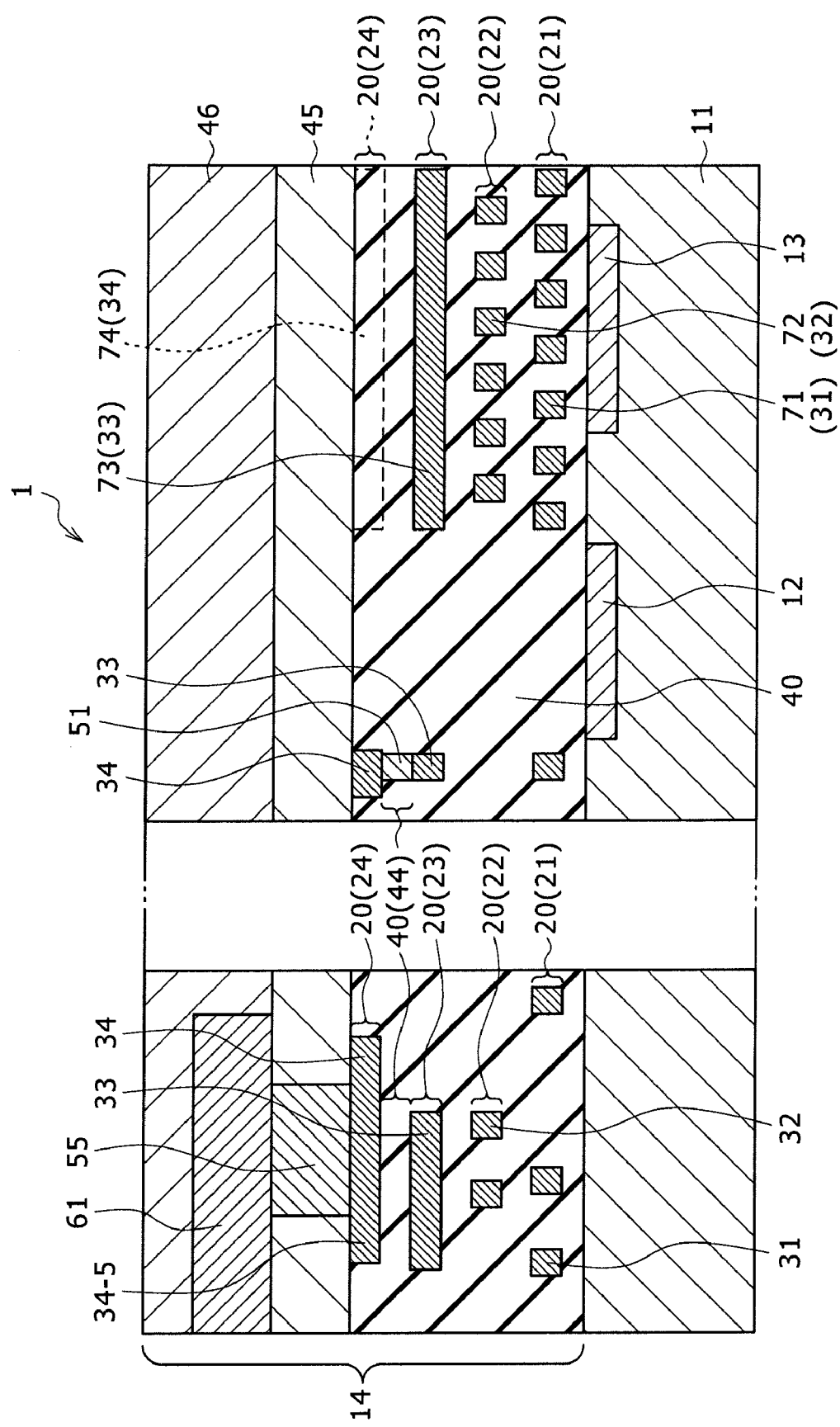
FIG. 1 is a schematic sectional view showing a general configuration of a first solid-state image pickup device according to a first embodiment of the present invention.

A first solid-state image pickup device according to a first embodiment of the present invention is described with reference to FIGS. 1 and 2. FIG. 1 shows a CMOS image sensor as an example of a solid-state image pickup device.

Referring first to FIG. 1, the first solid-state image pickup device 1 shown includes a light receiving pixel section 12 and a black level reference pixel section 13 each formed from a photodiode on a semiconductor substrate 11, and a multilayer wiring line section 14 formed on an upper face of the light receiving pixel section 12 and the black level reference pixel section 13.

The multilayer wiring line section 14 includes a plurality of metal wiring line layers 20 formed in a piled relationship on and in a spaced relationship from each other by a predetermined distance in the thicknesswise direction of the multilayer wiring line section 14 from the semiconductor substrate 11 side. The metal wiring line layers 20 include, for example, a first metal wiring line layer 21, a second metal wiring line layer 22, a third metal wiring line layer 23 and a fourth metal wiring line layer 24. The multilayer wiring line section 14 further includes an interlayer insulating film 40 for isolating the metal wiring line layers 20 from one another.

The metal wiring line layers 20 are each formed from metal wiring lines of, for example, copper (Cu), aluminum (Al) or tungsten (W) which are used as a wiring line material of a semiconductor device. Meanwhile, the interlayer insulating film 40 is formed, for example, from a silicon oxide ($SiO_2$) film. The interlayer insulating film 40 may be made of any material which isolates metal wiring lines from one another and may be formed from an inorganic insulating film, an organic insulating film or a like film having a light transmitting property.

A contact plug 51 is formed in the interlayer insulating film 40 (44) between one of the metal wiring line layers 20, for example, the fourth metal wiring line layer 24, and another one of the metal wiring line layers 20 underlying the fourth metal wiring line layer 24, for example, the third metal wiring line layer 23. The contact plug 51 extends through the interlayer insulating film 44 to connect a fourth metal wiring line 34 of the fourth metal wiring line layer 24 and a third metal wiring line 33 of the underlying third metal wiring line layer 23 to each other. Naturally, though not shown, also metal wiring lines which are connected by a contact plug exist between the other metal wiring line layers and between the other metal wiring lines.

Further, an interlayer insulating film 45 is formed in such a manner as to cover over an upper face of that one of the metal wiring line layers 20 positioned at the uppermost position, that is, the fourth metal wiring line layer 24. A pad 61 is formed from aluminum (Al) on an upper face of the interlayer insulating film 45 and used to establish electric connected to a peripheral circuit (not shown) of the like.

Another contact plug 55 is formed in the interlayer insulating film 45 between the pad 61 and a fourth metal wiring line 34-5 of the fourth metal wiring line layer 24 positioned just below the pad 61 and extends through the interlayer insulating film 45 to connect the pad 61 and the fourth metal wiring line 34-5 to each other. The contact plug 55 is formed, for example, from aluminum (Al). Further, an interlayer insulating film 46 is formed so as to cover over the pad 61.

A light blocking film is formed at a position opposing to the photodiode of the black level reference pixel section 13.

In particular, some of a plurality of first metal wiring lines 31 formed from the first metal wiring line layer 21 from among the metal wiring line layers 20 are disposed in a predetermined spaced relationship from each other and in a plurality of rows above the black level reference pixel section 13 to form a first light blocking film 71.

Further, some of a plurality of second metal wiring lines 32 formed from the second metal wiring line layer 22 above the first metal wiring line layer 21 are disposed above and between the first metal wiring lines 31 above the black level reference pixel section 13 to form a second light blocking film 72.

In other words, the second light blocking film 72 is formed in such a state that the array thereof is displaced by one half cycle from the array of the first light blocking film 71.

Further, some of a plurality of third metal wiring lines 33 formed from the third metal wiring line layer 23 above the second metal wiring line layer 22 are disposed in a predetermined spaced relationship from each other and in a plurality of rows in a direction perpendicular to the second light blocking film 72 formed from the second metal wiring lines 32 to form a third light blocking film 73 above the black level reference pixel section 13.

Furthermore, some of a plurality of fourth metal wiring lines 34 formed from the fourth metal wiring line layer 24 above the third metal wiring line layer 23 are disposed between and above the third metal wiring lines 33 above the black level reference pixel section 13 to form a fourth light blocking film 74.

In other words, the fourth light blocking film 74 is formed in such a state that the array thereof is displaced by one half cycle from the array of the third light blocking film 73.

Referring now to FIGS. 2A and 2B, the first light blocking film 71 can be formed in a pattern of a minimum wiring line width and a minimum space, for example, of a line and space L/S=100 nm/100 nm. Meanwhile, the second light blocking film 72 is disposed in a displaced relationship by one half cycle from the first light blocking film 71 such that no gap can be found as viewed from above the pattern, that is, as viewed in plan.

Further, the third light blocking film 73 can be formed in a pattern of a minimum wiring line width and a minimum space, for example of a line and space L/s=100 nm/100 nm, and is disposed in a direction perpendicular to the second light blocking film 72 as viewed from above the pattern, that is, as viewed in plan. Meanwhile, the fourth light blocking film 74 is disposed in a displaced relationship by one half cycle from the third light blocking film 73 such that no gap can be found as viewed from above the pattern, that is, as viewed in plan.

Where the first to fourth light blocking films 71 to 74 are configured in a laminated relationship from each other in such a manner as described above, even if the wiring line film thickness per one layer of intermediate layers, for example, in the 65 nm generation, is 170 nm, the multi-layer wiring line structure can be utilized to achieve a wiring line film thickness of 340 nm (=170 nm×2 layers) substantially for two layers. A thick layer structure of the light blocking film can be achieved in this manner, and a film thickness of the light blocking layer which is greater than 225 nm which is a wiring line film thickness of intermediate layers in LSIs in the 90 nm generation can be achieved.

Further, since the light blocking layer can be formed from wiring lines having a line width within a design rule within which dishing or erosion by chemical-mechanical polishing can be suppressed, dishing wherein copper (Cu) at a wiring line central portion is polished excessively, which occurs uniquely with a copper (Cu) wiring line, can be reduced in comparison with light blocking films in related art having a line width of several tens to 100 μm which deviates from the design rule.

While, in the description of the first embodiment above, the metal wiring line layers 20 formed in four layers are described as an example, the number of such metal wiring line layers 20 may be more than four. In this instance, successive four ones of the metal wiring line layers 20 may be used to form the first light blocking film 71, second light blocking film 72, third light blocking film 73 and fourth light blocking film 74.

Further, where the number of metal wiring line layers 20 is more than six, light blocking films similar to the first light blocking film 71 and the second light blocking film 72 can be formed such that they extend perpendicularly to the third light blocking film 73 and the fourth light blocking film 74. Further where the number of metal wiring line layers 20 is greater than eight, two or more sets of the first to fourth light blocking films 71 to 74 described above can be formed. In other words, the light blocking films can be formed in accordance with the number of metal wiring line layers.

The first solid-state image pickup device 1 according to the first embodiment of the present invention includes a first light blocking film 71 wherein some of a plurality of first metal wiring lines 31 formed from a first metal wiring line layer 21 from among metal wiring line layers 20 are disposed in a predetermined spaced relationship from each other and in a plurality of rows above a black level reference pixel section 13 and a second light blocking film 72 wherein some of a plurality of second metal wiring lines 32 formed from a second metal wiring line layer 22 on the first metal wiring line layer 21 are disposed between and above the first metal wiring lines 31 above the black level reference pixel section 13. Therefore, as viewed in plan, the black level reference pixel section 13 is covered with the first light blocking film 71 and the second light blocking film 72. Further, the first solid-state image pickup device 1 has, above the black level reference pixel section 13, a third light blocking film 73 wherein some of a plurality of third metal wiring lines 33 formed from a third metal wiring line layer 23 above the second metal wiring line layer 22 are disposed in a plurality of rows and in a predetermined spaced relationship from each other in a direction perpendicular to the second light blocking film 72 formed from the second metal wiring lines 32, and a fourth light blocking film 74 wherein some of a plurality of fourth metal wiring lines 34 formed from a fourth metal wiring line layer 24 above the third metal wiring line layer 23 are disposed between and above the third metal wiring lines 33 above the black level reference pixel section 13. Therefore, as viewed in plan, the black level reference pixel section 13 is covered with the third light blocking film 73 and the fourth light blocking film 74.

Besides, since the third light blocking film 73 and the fourth light blocking film 74 are disposed in a direction perpendicular to the first light blocking film 71 and the second light blocking film 72, the light blocking property for obliquely incident light is enhanced, and a light blocking film is formed substantially from two metal wiring line layers. Accordingly, in comparison with a light blocking film in related art formed from a single metal wiring line layer, the total film thickness of the light blocking film can be increased.

Consequently, even if wiring lines are formed from a reduced thickness together with refinement, the light blocking property of the light blocking film formed from a film in the same layer as that of the wiring lines can be maintained or raised. Thus, there is an advantage that the light blocking film has a light blocking property ready for LSIs in the future generations.

Further, since the first light blocking film 71 includes wiring lines disposed in a predetermined spaced relationship from each other and in a plurality of rows, it can be formed with a line width with which dishing or erosion does not occur. Therefore, even if chemical-mechanical polishing is used for formation of the light blocking film, the film thickness of the light blocking film can be assured to a film thickness of a designed value. Therefore, deterioration of the light blocking property can be prevented. Since also the second light blocking film 72, third light blocking film 73 and fourth light blocking film 74 can be formed with a line width with which dishing or erosion does not occur, a similar effect to that achieved by the first light blocking film 71 can be achieved.

Accordingly, since each light blocking film can assure a predetermined film thickness, deterioration of the light blocking performance can be prevented.

Therefore, admission of light to the photodiode region of the black level reference pixel section 13 can be blocked by the light blocking films of four layers including the first light blocking film 71, second light blocking film 72, third light blocking film 73 and fourth light blocking film 74.

Now, a first solid-state image pickup device according to a second embodiment of the present invention is described with reference to FIGS. 3 and 4. FIG. 3 particularly shows a CMOS image sensor as an example of the solid-state image pickup device.

Referring first to FIG. 3, the first solid-state image pickup device 2 shown includes a light receiving pixel section 12 and a black level reference pixel section 13 each formed from a photodiode on a semiconductor substrate 11, and a multilayer wiring line section 14 formed on an upper face of the light receiving pixel section 12 and the black level reference pixel section 13.

The multilayer wiring line section 14 includes a plurality of metal wiring line layers 20 formed in a piled relationship on and in a spaced relationship from each other by a predetermined distance in the thicknesswise direction of the multilayer wiring line section 14 from the semiconductor substrate 11 side. The metal wiring line layers 20 include, for example, a first metal wiring line layer 21, a second metal wiring line layer 22, a third metal wiring line layer 23 and a fourth metal wiring line layer 24. The multilayer wiring line section 14 further includes an interlayer insulating film 40 for isolating the metal wiring line layers 20 from one another.

The metal wiring line layers 20 are each formed from metal wiring lines of, for example, copper (Cu), aluminum (Al) or tungsten (W) which are used as a wiring line material of a semiconductor device. Meanwhile, the interlayer insulating film 40 is formed, for example, from a silicon oxide ($SiO_2$) film. The interlayer insulating film 40 may be made of any material which isolates metal wiring lines from one another and may be formed from an inorganic insulating film, an organic insulating film or a like film having a light transmitting property.

A contact plug 51 is formed in the interlayer insulating film 40 (44) between one of the metal wiring line layers 20, for example, the fourth metal wiring line layer 24, and another one of the metal wiring line layers 20 underlying the fourth metal wiring line layer 24, for example, the third metal wiring line layer 23. The contact plug 51 extends through the interlayer insulating film 44 to connect a fourth metal wiring line 34 of the fourth metal wiring line layer 24 and a third metal wiring line 33 of the underlying third metal wiring line layer 23 to each other. Naturally, though not shown, also metal wiring lines which are connected by a contact plug exist between the other metal wiring line layers and between the other metal wiring lines.

Further, an interlayer insulating film 45 is formed in such a manner as to cover over an upper face of that one of the metal wiring line layers 20 positioned at the uppermost position, that is, the fourth metal wiring line layer 24. A pad 61 is formed from aluminum (Al) on an upper face of the interlayer insulating film 45 and used to establish electric connected to a peripheral circuit (not shown) or the like.

Another contact plug 55 is formed in the interlayer insulating film 45 between the pad 61 and a fourth metal wiring line 34-5 of the fourth metal wiring line layer 24 positioned just below the pad 61 and extends through the interlayer insulating film 45 to connect the pad 61 and the fourth metal wiring line 34-5 to each other. The contact plug 55 is formed, for example, from aluminum (Al). Further, an interlayer insulating film 46 is formed so as to cover over the pad 61.

A light blocking film is formed at a position opposing to the photodiode of the black level reference pixel section 13.

In particular, some of a plurality of first metal wiring lines 31 formed from the first metal wiring line layer 21 from among the metal wiring line layers 20 are disposed in a predetermined spaced relationship from each other and in a plurality of rows above the black level reference pixel section 13 to form a first light blocking film 71.

Further, some of a plurality of second metal wiring lines 32 formed from the second metal wiring line layer 22 above the first metal wiring line layer 21 are disposed above and between the first metal wiring lines 31 above the black level reference pixel section 13 to form a second light blocking film 72. The second light blocking film 72 is formed in an overlapping relationship above and with the first light blocking film 71. For example, the second light blocking film 72 is formed in an overlapping relationship with an edge of the first light blocking film 71 as viewed in plan.

In other words, the second light blocking film 72 is formed in such a state that the array thereof is displaced by one half cycle from the array of the first light blocking film 71.

Further, some of a plurality of third metal wiring lines 33 formed from the third metal wiring line layer 23 above the second metal wiring line layer 22 are disposed in a predetermined spaced relationship from each other and in a plurality of rows in a direction perpendicular to the second light blocking film 72 formed from the second metal wiring lines 32 to form a third light blocking film 73 above the black level reference pixel section 13.

Furthermore, some of a plurality of fourth metal wiring lines 34 formed from the fourth metal wiring line layer 24 above the third metal wiring line layer 23 are disposed between and above the third metal wiring lines 33 above the black level reference pixel section 13 to form a fourth light blocking film 74. Then, the fourth light blocking film 74 is formed in an overlapping relationship above and with part of the third light blocking film 73. For example, the fourth light blocking film 74 is formed in an overlapping relationship with an edge of the third light blocking film 73 as viewed in plan.

In other words, the fourth light blocking film 74 is formed in such a state that the array thereof is displaced by one half cycle from the array of the third light blocking film 73.

Referring now to FIGS. 4A and 4B, the first light blocking film 71 can be formed in a pattern of a wiring line width and a space, for example, of a line and space L/S=3,000 nm/350 nm with which suppression of dishing is possible. Meanwhile, the second light blocking film 72 is disposed in a displaced relationship by one half cycle from the first light blocking film 71 such that no gap can be found as viewed from above the pattern, that is, as viewed in plan.

Further, the third light blocking film 73 can be formed in a pattern of a wiring line width and a space, for example, of a line and space L/S=3,000 nm/350 nm, and is disposed in a direction perpendicular to the second light blocking film 72 as viewed from above the pattern, that is, as viewed in plan. Meanwhile, the fourth light blocking film 74 is disposed in a displaced relationship by one half cycle from the third light blocking film 73 such that no gap can be found as viewed from above the pattern, that is, as viewed in plan.

The example described above is one example, and depending upon the chemical-mechanical polishing condition, the width of the light blocking film can be further increased. For example, the line width of the first to fourth light blocking films 71 to 74 is preferably set smaller than 5 μm. More preferably, the line width is set smaller than 3 μm.

Also the space is not limited to 350 nm, and the width of the space can be determined taking, for example, the workability of the space into consideration. For example, the space can be set within a range of 200 to 400 nm.

Where the first to fourth light blocking films 71 to 74 are configured in a laminated relationship from each other in such a manner as described above, even if the wiring line film thickness per one layer of intermediate layers, for example, in the 65 nm generation, is 170 nm, the multi-layer wiring line structure can be utilized to achieve a wiring line film thickness of 340 nm (=170 nm×2 layers) substantially for two layers and achieve, at a comparatively thick portion, a wiring line film thickness of 510 nm (=170 nm×3 layers) substantially corresponding to the thickness of three layers. A thick layer structure of the light blocking film can be achieved in this manner, and a film thickness of the light blocking layer which is greater than 225 nm which is a wiring line film thickness of intermediate layers in LSIs in the 90 nm generation can be achieved.

Further, since the light blocking layer can be formed from wiring lines having a line width within a design rule within which dishing or erosion by chemical-mechanical polishing can be suppressed, dishing wherein copper (Cu) at a wiring line central portion is polished excessively, which occurs uniquely with a copper (Cu) wiring line, can be reduced in comparison with light blocking films in related art having a line width of several tens to 100 μm which deviates from the design rule.

While, in the foregoing description of the second embodiment, the first light blocking film 71, second light blocking film 72, third light blocking film 73 and fourth light blocking film 74 have line patterns of an equal line width, for example, if a line pattern of a width greater than that of a space between light blocking films in a lower layer is used, then the line widths of the light blocking films may be different from each other. For example, where some light blocking film is used as a wiring line, in order to reduce the wiring line resistance, it may be formed as a line pattern of a greater width than that of the light blocking films of the other layers.

While, in the description of the second embodiment above, the metal wiring line layers 20 formed in four layers are described as an example, the number of such metal wiring line layers 20 may be more than four. In this instance, successive four ones of the metal wiring line layers 20 may be used to form the first light blocking film 71, second light blocking film 72, third light blocking film 73 and fourth light blocking film 74.

Further, where the number of metal wiring line layers 20 is more than six, light blocking films similar to the first light blocking film 71 and the second light blocking film 72 can be formed such that they extend perpendicularly to the third light blocking film 73 and the fourth light blocking film 74. Further where the number of metal wiring line layers 20 is greater than eight, two or more sets of the first to fourth light blocking films 71 to 74 described above can be formed. In other words, the light blocking films can be formed in accordance with the number of metal wiring line layers.

The first solid-state image pickup device 2 according to the second embodiment of the present invention includes a first light blocking film 71 wherein some of a plurality of first metal wiring lines 31 formed from a first metal wiring line layer 21 from among metal wiring line layers 20 are disposed in a predetermined spaced relationship from each other and in a plurality of rows above a black level reference pixel section 13 and a second light blocking film 72 wherein some of a plurality of second metal wiring lines 32 formed from a second metal wiring line layer 22 on the first metal wiring line layer 21 are disposed between and above the first metal wiring lines 31 above the black level reference pixel section 13. Therefore, as viewed in plan, the black level reference pixel section 13 is covered with the first light blocking film 71 and the second light blocking film 72. Further, the first solid-state image pickup device 2 has, above the black level reference pixel section 13, a third light blocking film 73 wherein some of a plurality of third metal wiring lines 33 formed from a third metal wiring line layer 23 above the second metal wiring line layer 22 are disposed in a plurality of rows and in a predetermined spaced relationship from each other in a direction perpendicular to the second light blocking film 72 formed from the second metal wiring lines 32, and a fourth light blocking film 74 wherein some of a plurality of fourth metal wiring lines 34 formed from a fourth metal wiring line layer 24 above the third metal wiring line layer 23 are disposed between and above the third metal wiring lines 33 above the black level reference pixel section 13. Therefore, as viewed in plan, the black level reference pixel section 13 is covered with the third light blocking film 73 and the fourth light blocking film 74.

Besides, since the third light blocking film 73 and the fourth light blocking film 74 are disposed in a direction perpendicular to the first light blocking film 71 and the second light blocking film 72, the light blocking property for obliquely incident light is enhanced, and a light blocking film is formed substantially from two metal wiring line layers. Accordingly, in comparison with a light blocking film in related art formed from a single metal wiring line layer, the total film thickness of the light blocking film can be increased.

Figure 5:
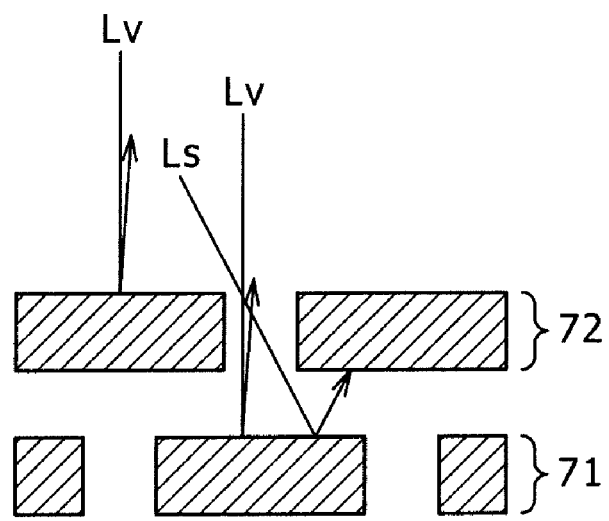
FIGS. 5 and 6 are schematic sectional views illustrating different light blocking states of light blocking films when incident light is introduced thereto obliquely.

Further, since the second light blocking film 72 is formed in an overlapping relationship above and with part of the first light blocking film 71 as seen in FIG. 5, it can block not only vertical incident light Lv but also oblique incident light Ls with certainty.

Figure 6:
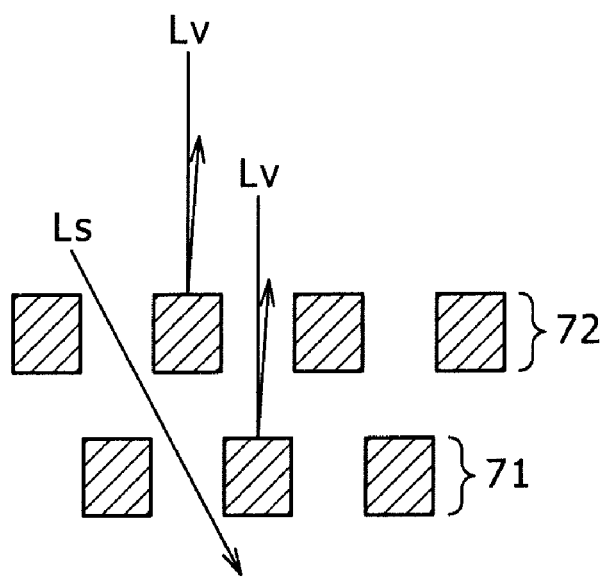

On the other hand, where the second light blocking film 72 is not formed in an overlapping relationship above and with part of the first light blocking film 71 as seen in FIG. 6, although the second light blocking film 72 can block vertical incident light Lv with certainty, part of oblique incident light Ls may possibly pass between light blocking films, for example, between the first light blocking film 71 and the second light blocking film 72, resulting in deterioration of the light blocking property.

Thus, where the second light blocking film 72 is formed in such an overlapping relationship as described above, even if a wiring line is formed as a thin film for refinement, the light blocking property of the light blocking film formed from a film in the same layer as that of the wiring line can be maintained or raised. Thus, there is an advantage that the light blocking film has a light blocking property ready for LSIs in the future generations.

Further, since the first light blocking film 71 includes wiring lines disposed in a predetermined spaced relationship from each other and in a plurality of rows, it can be formed with a line width with which dishing or erosion does not occur. Therefore, even if chemical-mechanical polishing is used for formation of the light blocking film, the film thickness of the light blocking film can be assured to a film thickness of a designed value. Therefore, deterioration of the light blocking property can be prevented. Since also the second light blocking film 72, third light blocking film 73 and fourth light blocking film 74 can be formed with a line width with which dishing or erosion does not occur, a similar effect to that achieved by the first light blocking film 71 can be achieved.

Accordingly, since each light blocking film can assure a predetermined film thickness, deterioration of the light blocking performance can be prevented.

Now, a second solid-state image pickup device according to a third embodiment of the present invention is described with reference to FIGS. 7 and 8. FIG. 7 particularly shows a CMOS image sensor as an example of the solid-state image pickup device.

Referring first to FIG. 7, the second solid-state image pickup device 3 shown includes a light receiving pixel section 12 and a black level reference pixel section 13 each formed from a photodiode on a semiconductor substrate 11, and a multilayer wiring line section 14 formed on an upper face of the light receiving pixel section 12 and the black level reference pixel section 13.

The multilayer wiring line section 14 includes a plurality of metal wiring line layers 20 formed in a piled relationship on and in a spaced relationship from each other by a predetermined distance in the thicknesswise direction of the multilayer wiring line section 14 from the semiconductor substrate 11 side. The metal wiring line layers 20 include, for example, a first metal wiring line layer 21, a second metal wiring line layer 22, a third metal wiring line layer 23 and a fourth metal wiring line layer 24. The multilayer wiring line section 14 further includes an interlayer insulating film 40 for isolating the metal wiring line layers 20 from one another.

The metal wiring line layers 20 are each formed from metal wiring lines of, for example, copper (Cu), aluminum (Al) or tungsten (W) which are used as a wiring line material of a semiconductor device. Meanwhile, the interlayer insulating film 40 is formed, for example, from a silicon oxide ($SiO_2$) film. The interlayer insulating film 40 may be made of any material which isolates metal wiring lines from one another and may be formed from an inorganic insulating film, an organic insulating film or a like film having a light transmitting property.

A contact plug 51 is formed in the interlayer insulating film 40 (44) between one of the metal wiring line layers 20, for example, the fourth metal wiring line layer 24, and another one of the metal wiring line layers 20 underlying the fourth metal wiring line layer 24, for example, the third metal wiring line layer 23. The contact plug 51 extends through the interlayer insulating film 44 to connect a fourth metal wiring line 34 of the fourth metal wiring line layer 24 and a third metal wiring line 33 of the underlying third metal wiring line layer 23 to each other. Naturally, though not shown, also metal wiring lines which are connected by a contact plug exist between the other metal wiring line layers and between the other metal wiring lines.

Further, an interlayer insulating film 45 is formed in such a manner as to cover over an upper face of that one of the metal wiring line layers 20 positioned at the uppermost position, that is, the fourth metal wiring line layer 24. A pad 61 is formed from aluminum (Al) on an upper face of the interlayer insulating film 45 and used to establish electric connected to a peripheral circuit (not shown) or the like.

Another contact plug 55 is formed in the interlayer insulating film 45 between the pad 61 and a fourth metal wiring line 34-5 of the fourth metal wiring line layer 24 positioned just below the pad 61 and extends through the interlayer insulating film 45 to connect the pad 61 and the fourth metal wiring line 34-5 to each other. The contact plug 55 is formed, for example, from aluminum (Al). Further, an interlayer insulating film 46 is formed so as to cover over the pad 61.

A light blocking film is formed at a position opposing to the photodiode of the black level reference pixel section 13.

In particular, some of a plurality of first metal wiring lines 31 formed from the first metal wiring line layer 21 from among the metal wiring line layers 20 are disposed in a predetermined spaced relationship from each other and in a plurality of rows above the black level reference pixel section 13 to form a first light blocking film 71.

Further, some of a plurality of second metal wiring lines 32 formed from the second metal wiring line layer 22 above the first metal wiring line layer 21 are disposed above and between the first metal wiring lines 31 above the black level reference pixel section 13 to form a second light blocking film 72.

In other words, the second light blocking film 72 is formed in such a state that the array thereof is displaced by one half cycle from the array of the first light blocking film 71.

Further, the set of the first light blocking film 71 and the second light blocking film 72 is provided in a plurality of layers above the black level reference pixel section 13.

For example, some of the third metal wiring lines 33 formed from the third metal wiring line layer 23 above the second metal wiring line layer 22 are disposed between and above the second metal wiring lines 32 above the black level reference pixel section 13 to form the third light blocking film 73.

Further, some of the fourth metal wiring lines 34 formed from the fourth metal wiring line layer 24 above the third metal wiring line layer 23 are disposed between and above the third metal wiring line 33 above the black level reference pixel section 13 to form the fourth light blocking film 74.

For example, the array of the fourth light blocking film 74 is formed in a displaced relationship by one half cycle from the array of the third light blocking film 73.

Further, the array of the third light blocking film 73 is formed in a displaced relationship by one half cycle from the array of the second light blocking film 72.

Figure 8B:
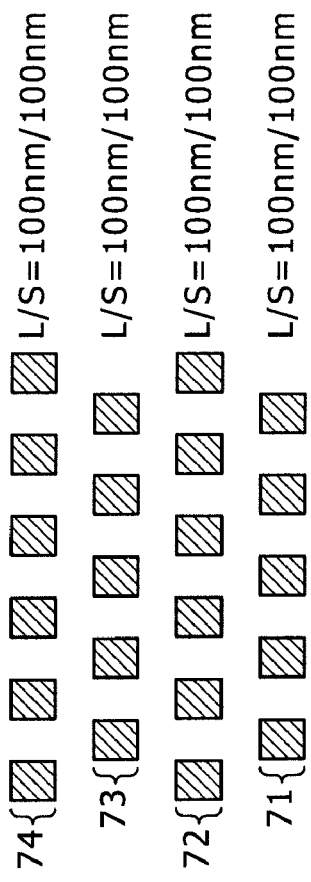
FIGS. 8A and 8B illustrate a perspective view and a schematic sectional view of part of a light blocking film of the second solid-state image pickup device of FIG. 7.
Figure 8A:
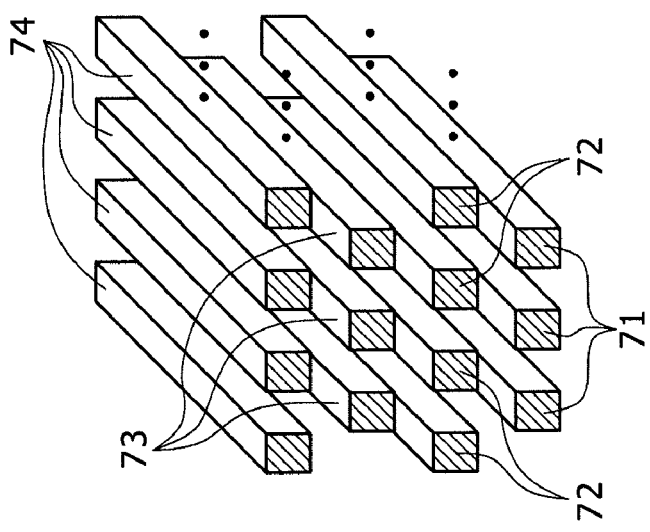

Referring now to FIGS. 8A and 8B, the first light blocking film 71 can be formed in a pattern of a minimum wiring line width and a minimum space, for example, of a line and space L/S=100 nm/100 nm. Meanwhile, the second light blocking film 72 is disposed in a displaced relationship by one half cycle from the first light blocking film 71 such that no gap can be found as viewed from above the pattern, that is, as viewed in plan.

Further, the third light blocking film 73 can be formed in a pattern of a minimum wiring line width and a minimum space, for example of a line and space L/S=100 nm/100 nm, and is disposed in a direction perpendicular to the second light blocking film 72 as viewed from above the pattern, that is, as viewed in plan. Meanwhile, the fourth light blocking film 74 is disposed in a displaced relationship by one half cycle from the third light blocking film 73 such that no gap can be found as viewed from above the pattern, that is, as viewed in plan.

Where the first to fourth light blocking films 71 to 74 are configured in a laminated relationship from each other in such a manner as described above, even if the wiring line film thickness per one layer of intermediate layers, for example, in the 65 nm generation, is 170 nm, the multi-layer wiring line structure can be utilized to achieve a wiring line film thickness of 340 nm (=170 nm×2 layers) substantially for two layers. A thick layer structure of the light blocking film can be achieved in this manner, and a film thickness of the light blocking layer which is greater than 225 nm which is a wiring line film thickness of intermediate layers in LSIs in the 90 nm generation can be achieved.

Further, since the light blocking layer can be formed from wiring lines having a line width within a design rule within which dishing or erosion by chemical-mechanical polishing can be suppressed, dishing wherein copper (Cu) at a wiring line central portion is polished excessively, which occurs uniquely with a copper (Cu) wiring line, can be reduced in comparison with light blocking films in related art having a line width of several tens to 100 μm which deviates from the design rule.

While, in the description of the third embodiment above, the metal wiring line layers 20 formed in four layers are described as an example, the number of such metal wiring line layers 20 may be more than four. In this instance, successive four ones of the metal wiring line layers 20 may be used to form the first light blocking film 71, second light blocking film 72, third light blocking film 73 and fourth light blocking film 74.

Further, where the metal wiring line layers 20 are formed in n (n is a natural number equal to or greater than 6) or more layers and the first light blocking film 71 and the second light blocking film 72 form one set, if n is an even number, then n/2 sets can be formed, but where n is an odd number, (n−1)/2 sets can be formed. In other words, light blocking films can be formed in accordance with the number of metal wiring line layers.

In the second solid-state image pickup device 3 according to the third embodiment of the present invention, when a plurality of first metal wiring lines 31 are formed from the first metal wiring line layer 21 from among the metal wiring line layers 20, some of the first metal wiring lines 31 are disposed in a predetermined spaced relationship from each other and in a plurality of rows above the black level reference pixel section 13 to form the first light blocking film 71. Further, when a plurality of second metal wiring lines 32 are formed from the second metal wiring line layer 22 on the first metal wiring line layer 21, some of the second metal wiring lines 32 are disposed between and above the first metal wiring lines 31 above the black level reference pixel section 13 to form the second light blocking film 72. Therefore, the black level reference pixel section 13 is covered with the first light blocking film 71 and the second light blocking film 72 as viewed in plan.

Besides, since a plurality of sets of the first light blocking film 71 and the second light blocking film 72 are provided above the black level reference pixel section 13, the light blocking property for oblique incident light is enhanced. Where at least two sets of the first light blocking film 71 and the second light blocking film 72 are provided, a light blocking film is formed from substantially two metal wiring line layers.

Accordingly, in comparison with a light blocking film in related art which is formed from one metal wiring line layer, the light blocking film can be formed with an increased total film thickness. Naturally, where three or more sets of the first light blocking film 71 and the second light blocking film 72 are provided, the light blocking property is increased in accordance with the number of sets.

This provides an advantage that, even if the metal wiring line layers 20 is formed as a reduced thickness film, they form a light blocking film having a light blocking property ready for LSIs in the future generations.

Further, since the first light blocking film 71 includes wiring lines disposed in a predetermined spaced relationship from each other and in a plurality of rows, it can be formed with a line width with which dishing or erosion does not occur. Therefore, even if chemical-mechanical polishing is used for formation of the light blocking film, the film thickness of the light blocking film can be assured to a film thickness of a designed value. Therefore, deterioration of the light blocking property can be prevented. Since also the second light blocking film 72, third light blocking film 73 and fourth light blocking film 74 can be formed with a line width with which dishing or erosion does not occur, a similar effect to that achieved by the first light blocking film 71 can be achieved.

Accordingly, since each light blocking film can assure a predetermined film thickness, deterioration of the light blocking performance can be prevented.

Therefore, admission of light to the photodiode region of the black level reference pixel section 13 can be blocked by the light blocking films of four layers including the first light blocking film 71, second light blocking film 72, third light blocking film 73 and fourth light blocking film 74.

Further, the second solid-state image pickup device according to the third embodiment described above is effective where, for example, a plurality of layers of wiring lines must be disposed in the same direction above the black level reference pixel section 13.

Figure 9:
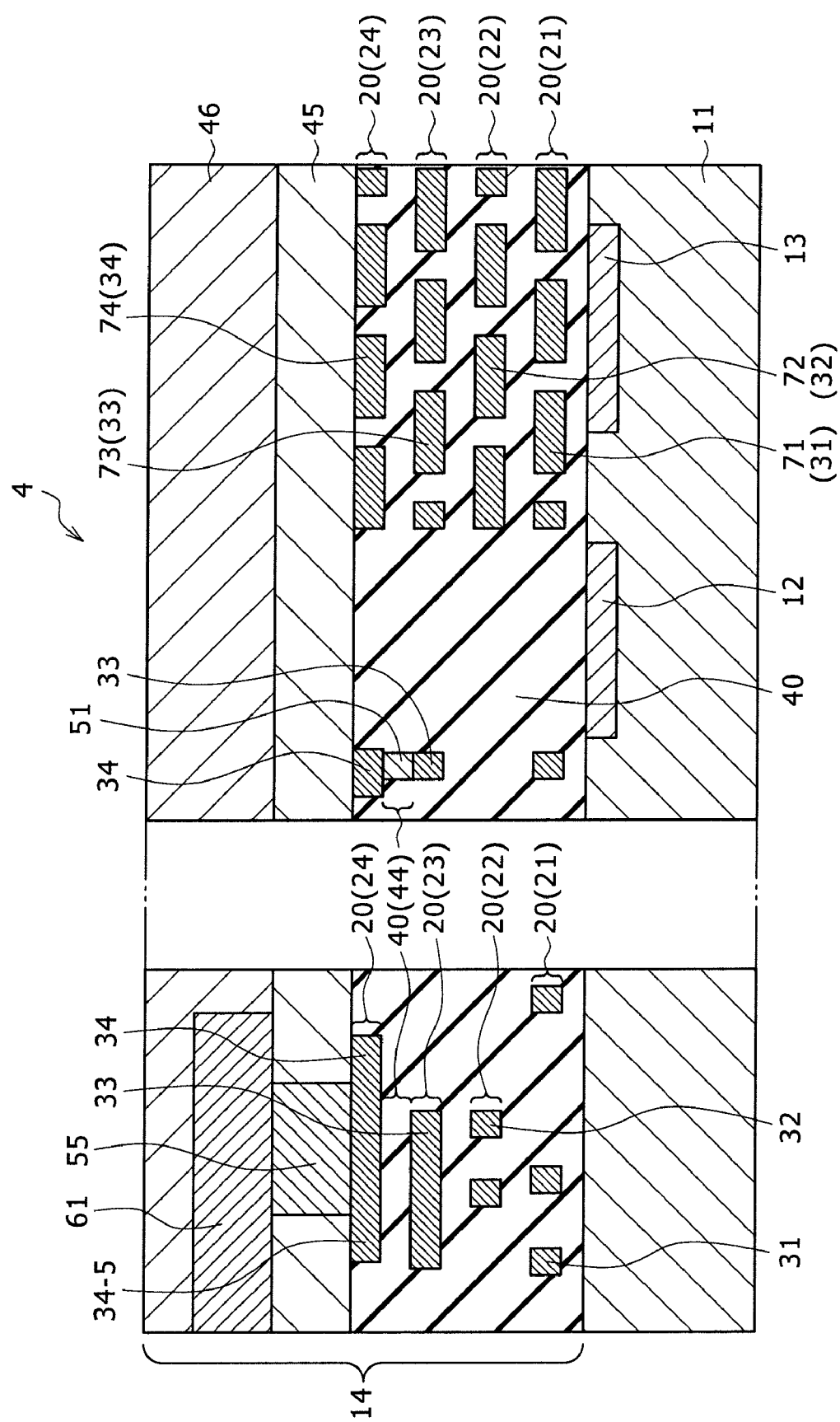
FIG. 9 is a schematic sectional view showing a general configuration of a second solid-state image pickup device according to a fourth embodiment of the present invention.

Now, a second solid-state image pickup device according to a fourth embodiment of the present invention is described with reference to FIGS. 9 and 10. FIG. 9 particularly shows a CMOS image sensor as an example of the solid-state image pickup device.

Referring first to FIG. 9, the second solid-state image pickup device 4 shown includes a light receiving pixel section 12 and a black level reference pixel section 13 each formed from a photodiode on a semiconductor substrate 11, and a multilayer wiring line section 14 formed on an upper face of the light receiving pixel section 12 and the black level reference pixel section 13.

The multilayer wiring line section 14 includes a plurality of metal wiring line layers 20 formed in a piled relationship on and in a spaced relationship from each other by a predetermined distance in the thicknesswise direction of the multilayer wiring line section 14 from the semiconductor substrate 11 side. The metal wiring line layers 20 include, for example, a first metal wiring line layer 21, a second metal wiring line layer 22, a third metal wiring line layer 23 and a fourth metal wiring line layer 24. The multilayer wiring line section 14 further includes an interlayer insulating film 40 for isolating the metal wiring line layers 20 from one another.

The metal wiring line layers 20 are each formed from metal wiring lines of, for example, copper (Cu), aluminum (Al) or tungsten (W) which are used as a wiring line material of a semiconductor device. Meanwhile, the interlayer insulating film 40 is formed, for example, from a silicon oxide (SiO$_2$) film. The interlayer insulating film 40 may be made of any material which isolates metal wiring lines from one another and may be formed from an inorganic insulating film, an organic insulating film or a like film having a light transmitting property.

A contact plug 51 is formed in the interlayer insulating film 40 (44) between one of the metal wiring line layers 20, for example, the fourth metal wiring line layer 24, and another one of the metal wiring line layers 20 underlying the fourth metal wiring line layer 24, for example, the third metal wiring line layer 23. The contact plug 51 extends through the interlayer insulating film 44 to connect a fourth metal wiring line 34 of the fourth metal wiring line layer 24 and a third metal wiring line 33 of the underlying third metal wiring line layer 23 to each other. Naturally, though not shown, also metal wiring lines which are connected by a contact plug exist between the other metal wiring line layers and between the other metal wiring lines.

Further, an interlayer insulating film 45 is formed in such a manner as to cover over an upper face of that one of the metal wiring line layers 20 positioned at the uppermost position, that is, the fourth metal wiring line layer 24. A pad 61 is formed from aluminum (Al) on an upper face of the interlayer insulating film 45 and used to establish electric connected to a peripheral circuit (not shown) or the like.

Another contact plug 55 is formed in the interlayer insulating film 45 between the pad 61 and a fourth metal wiring line 34-5 of the fourth metal wiring line layer 24 positioned just below the pad 61 and extends through the interlayer insulating film 45 to connect the pad 61 and the fourth metal wiring line 34-5 to each other. The contact plug 55 is formed, for example, from aluminum (Al). Further, an interlayer insulating film 46 is formed so as to cover over the pad 61.

A light blocking film is formed at a position opposing to the photodiode of the black level reference pixel section 13.

In particular, some of a plurality of first metal wiring lines 31 formed from the first metal wiring line layer 21 from among the metal wiring line layers 20 are disposed in a predetermined spaced relationship from each other and in a plurality of rows above the black level reference pixel section 13 to form a first light blocking film 71.

Further, some of a plurality of second metal wiring lines 32 formed from the second metal wiring line layer 22 above the first metal wiring line layer 21 are disposed above and between the first metal wiring lines 31 above the black level reference pixel section 13 to form a second light blocking film 72. The second light blocking film 72 is formed in an overlapping relationship above and with the first light blocking film 71. For example, the second light blocking film 72 is formed in an overlapping relationship with an edge of the first light blocking film 71 as viewed in plan.

In other words, the second light blocking film 72 is formed in such a state that the array thereof is displaced by one half cycle from the array of the first light blocking film 71.

Further, some of a plurality of third metal wiring lines 33 formed from the third metal wiring line layer 23 above the second metal wiring line layer 22 are disposed between and above the second metal wiring lines 32 above the black level reference pixel section 13 to form a third light blocking film 73. Then, the third light blocking film 73 is formed in an overlapping relationship above and with part of the second light blocking film 72. For example, the third light blocking film 73 is formed in an overlapping relationship with an edge of the second light blocking film 72 as viewed in plan.

In other words, the third light blocking film 73 is formed in such a state that the array thereof is displaced by one half cycle from the array of the second light blocking film 72.

Furthermore, some of a plurality of fourth metal wiring lines 34 formed from the fourth metal wiring line layer 24 above the third metal wiring line layer 23 are disposed between and above the third metal wiring lines 33 above the black level reference pixel section 13 to form a fourth light blocking film 74. Then, the fourth light blocking film 74 is formed in an overlapping relationship above and with part of the third light blocking film 73. For example, the fourth light blocking film 74 is formed in an overlapping relationship with an edge of the third light blocking film 73 as viewed in plan.

In other words, the fourth light blocking film 74 is formed in such a state that the array thereof is displaced by one half cycle from the array of the third light blocking film 73.

Referring now to FIGS. 10A and 10B, the first light blocking film 71 can be formed in a pattern of a wiring line width and a space, for example, of a line and space L/S=3,000 nm/350 nm with which suppression of dishing is possible. Meanwhile, the second light blocking film 72 is disposed in a displaced relationship by one half cycle from the first light blocking film 71 such that no gap can be found between the first light blocking film 71 and the second light blocking film 72 as viewed from above the pattern, that is, as viewed in plan.

Further, the third light blocking film 73 can be formed in a pattern of a wiring line width and a space, for example, of a line and space L/S=3,000 nm/350 nm, and is disposed in a displaced relationship by one half cycle from the second light blocking film 72 such that no gap can be found between the second light blocking film 72 and the third light blocking film 73 as viewed from above the pattern, that is, as viewed in plan. Further, the fourth light blocking film 74 can be formed in a pattern of a wiring line width and a space, for example, of a line and space L/S=3,000 nm/350 nm, and is disposed in a displaced relationship by one half cycle from the third light blocking film 73 such that no gap can be found between the third light blocking film 73 and the fourth light blocking film 74 as viewed from above the pattern, that is, as viewed in plan.

The example described above is one example, and depending upon the chemical-mechanical polishing condition, the width of the light blocking film can be further increased. For example, the line width of the first to fourth light blocking films 71 to 74 is preferably set smaller than 5 μm. More preferably, the line width is set smaller than 3 μm.

Also the space is not limited to 350 nm, and the width of the space can be determined taking, for example, the workability of the space into consideration. For example, the space can be set within a range of 200 to 400 nm.

Where the first to fourth light blocking films 71 to 74 are configured in a laminated relationship from each other in such a manner as described above, even if the wiring line film thickness per one layer of intermediate layers, for example, in the 65 nm generation, is 170 nm, the multi-layer wiring line structure can be utilized to achieve a wiring line film thickness of 340 nm (=170 nm×2 layers) substantially for two layers and achieve, at a comparatively thick portion, a wiring line film thickness of 510 nm (=170 nm×3 layers) substantially corresponding to the thickness of three layers. A thick layer structure of the light blocking film can be achieved in this manner, and a film thickness of the light blocking layer which is greater than 225 nm which is a wiring line film thickness of intermediate layers in LSIs in the 90 nm generation can be achieved.

Further, the light blocking layer can be formed from wiring lines having a line width within a design rule within which dishing or erosion by chemical-mechanical polishing can be suppressed, dishing wherein copper (Cu) at a wiring line central portion is polished excessively, which occurs uniquely with a copper (Cu) wiring line, can be reduced in comparison with light blocking films in related art having a line width of several tens to 100 μm which deviates from the design rule.

While, in the foregoing description of the fourth embodiment, the first light blocking film 71, second light blocking film 72, third light blocking film 73 and fourth light blocking film 74 have line patterns of an equal line width, for example, if a line pattern of a width greater than that of a space between light blocking films in a lower layer is used, then the line widths of the light blocking films may be different from each other. For example, where some light blocking film is used as a wiring line, in order to reduce the wiring line resistance, it may be formed as a line pattern of a greater width than that of the light blocking films of the other layers.

While, in the description of the fourth embodiment above, the metal wiring line layers 20 formed in four layers are described as an example, the number of such metal wiring line layers 20 may be more than four. In this instance, successive four ones of the metal wiring line layers 20 may be used to form the first light blocking film 71, second light blocking film 72, third light blocking film 73 and fourth light blocking film 74.

Further, where the metal wiring line layers 20 are formed in n (n is a natural number equal to or greater than 6) or more layers and the first light blocking film 71 and the second light blocking film 72 form one set, if n is an even number, then n/2 sets can be formed, but where n is an odd number, (n−1)/2 sets can be formed. In other words, light blocking films can be formed in accordance with the number of metal wiring line layers.

In the second solid-state image pickup device 4 according to the fourth embodiment of the present invention, when a plurality of first metal wiring lines 31 are formed from the first metal wiring line layer 21 from among the metal wiring line layers 20, some of the first metal wiring lines 31 are disposed in a predetermined spaced relationship from each other and in a plurality of rows above the black level reference pixel section 13 to form the first light blocking film 71. Further, when a plurality of second metal wiring lines 32 are formed from the metal wiring line layer 22 on the first metal wiring line layer 21, some of the second metal wiring lines 32 are disposed between and above the first metal wiring lines 31 above the black level reference pixel section 13 to form the second light blocking film 72. Therefore, the black level reference pixel section 13 is covered with the first light blocking film 71 and the second light blocking film 72 as viewed in plan.

Besides, since a plurality of sets of the first light blocking film 71 and the second light blocking film 72 are provided above the black level reference pixel section 13, the light blocking property for oblique incident light is enhanced. Where at least two sets of the first light blocking film 71 and the second light blocking film 72 are provided, a light blocking film is formed from substantially two metal wiring line layers. Accordingly, in comparison with a light blocking film in related art which is formed from one metal wiring line layer, the light blocking film can be formed with an increased total film thickness. Naturally, where three or more sets of the first light blocking film 71 and the second light blocking film 72 are provided, the light blocking property is increased in accordance with the number of sets.

Consequently, even if the metal wiring line layers 20 is formed as a reduced thickness film, they form a light blocking film having a light blocking property ready for LSIs in the future generations.

Further, since the first light blocking film 71 includes wiring lines disposed in a predetermined spaced relationship from each other and in a plurality of rows, it can be formed with a line width with which dishing or erosion does not occur. Similarly, since also the second light blocking film 72 includes wiring lines disposed between and above those of the first light blocking film 71, the wiring lines are formed in a predetermined spaced relationship from each other and in a plurality of rows. Therefore, the second light blocking film 72 can be formed with a line width with which dishing or erosion does not occur similarly to the first light blocking film 71.

Accordingly, since each light blocking film can assure a predetermined film thickness, deterioration of the light blocking performance can be prevented.

Further, since the second light blocking film 72 is formed in an overlapping relationship above and with part of the first light blocking film 71 as seen in FIG. 5, it can block oblique incident light Ls with certainty. Also the third light blocking film 73 and the fourth light blocking film 74 are similar to the second light blocking film 72 in this regard.

Thus, where the second light blocking film 72 is formed in such an overlapping relationship as described above, even if a wiring line is formed as a thin film for refinement, the light blocking property of the light blocking film formed from a film in the same layer as that of the wiring line can be maintained or raised. Thus, there is an advantage that the light blocking film has a light blocking property ready for LSIs in the future generations.

Further, since the first light blocking film 71 includes wiring lines disposed in a predetermined spaced relationship from each other and in a plurality of rows, it can be formed with a line width with which dishing or erosion does not occur. Therefore, even if chemical-mechanical polishing is used for formation of the light blocking film, the film thickness of the light blocking film can be assured to a film thickness of a designed value. Therefore, deterioration of the light blocking property can be prevented. Since also the second light blocking film 72, third light blocking film 73 and fourth light blocking film 74 can be formed with a line width with which dishing or erosion does not occur, a similar effect to that achieved by the first light blocking film 71 can be achieved.

Accordingly, since each light blocking film can assure a predetermined film thickness, deterioration of the light blocking performance can be prevented.

The material of the metal wiring lines used in the embodiments 1 to 4 and the material of the contact plugs for connecting the metal wiring lines to each other may be any of metal materials used generally for metal wiring lines such as, for example, copper, aluminum, tungsten, aluminum alloys and copper alloys.

Meanwhile, the material used as a barrier metal for metal wiring lines may be, for example, titanium, tantalum, tungsten, and ruthenium, nitrides of the metals mentioned, alloys containing the metals as a main component, and laminated films selected from the metals, nitrides of the metals and the alloys of the metals.

In the embodiments 1 to 4, at least one of the first to fourth light blocking films 71 to 74 can be used also for electric connection. In other words, the light blocking film can be used also as a wiring line.

In this instance, the light blocking film can be used not only as an ordinary wiring line but also as a shunt wiring line. For example, for use in an application wherein current flows in high current density like a power supply wiring line, the light blocking film used as a shunt wiring line is effective as a countermeasure against the increase of the wiring line resistance caused by reduction in thickness of the wiring line. Particularly, the light blocking film is effective for reduction of the power consumption in a large-area solid-state image pickup device in which a long wiring line distance cannot be avoided.

Further, in the configuration wherein a light blocking layer in an upper layer and another light blocking layer in a lower layer are formed in a partly overlapping relationship with each other, it is possible to connect the light blocking films in the different layers to each other by a contact plug so that they act as a single wiring line.

Figure 11:
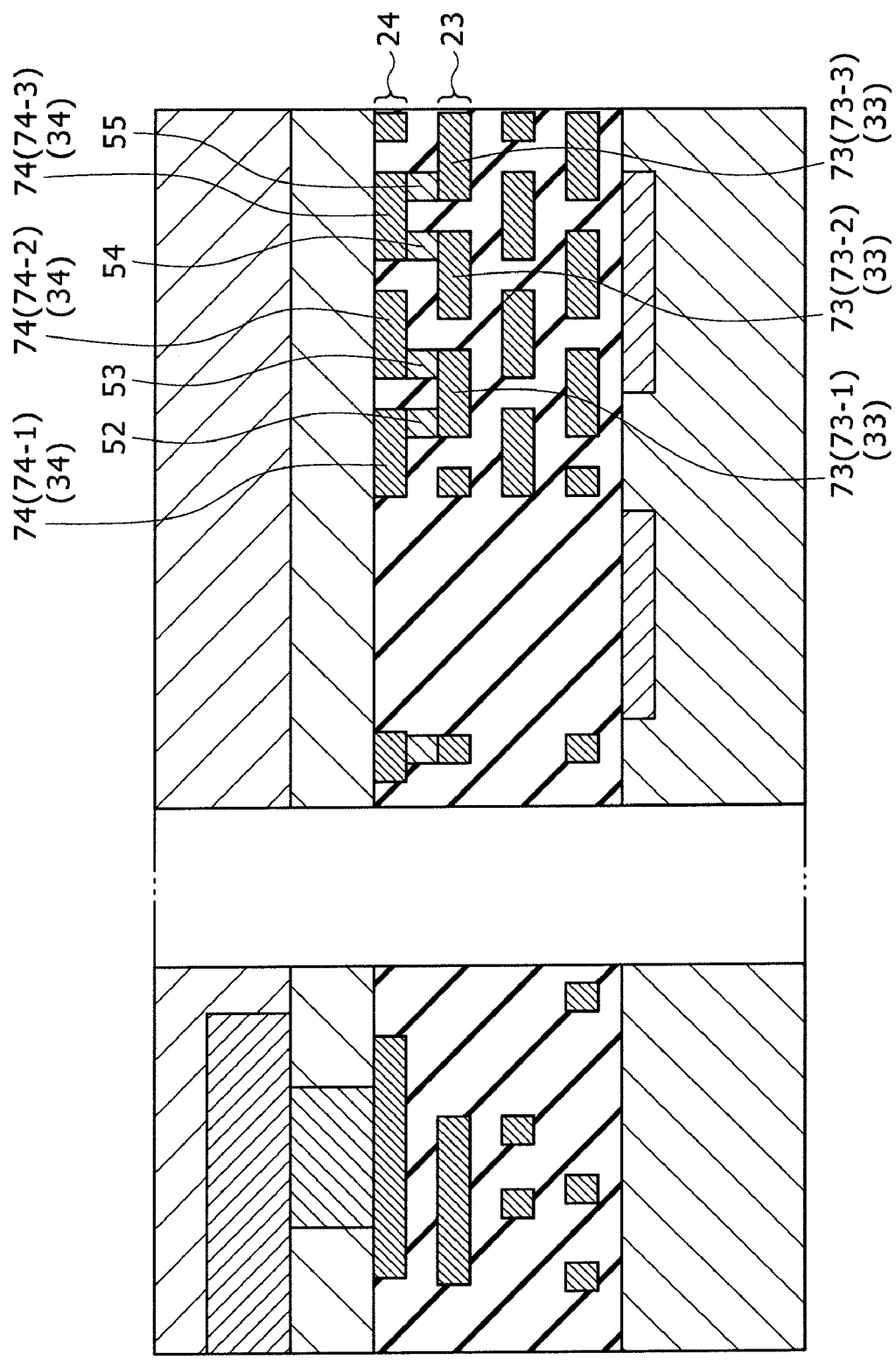
FIG. 11 is a schematic sectional view showing a general configuration of an example of a solid-state image pickup device wherein a light blocking film serves also as a wiring line.

For example, referring to FIG. 11, a third light blocking film 73 (73-1) formed from third metal wiring lines 33 of a third metal wiring line layer 23 and a fourth light blocking film 74 (74-1) and another fourth light blocking film 74 (74-2) formed from fourth metal wiring lines 34 of a fourth metal wiring line layer 24 can be connected to each other by contact plugs 52 and 53, respectively, such that the three light blocking films are used as a single wiring line.

Or, also it is possible to connect a third light blocking film 73 (73-2) and another third light blocking film 73 (73-3) formed from third metal wiring lines 33 of a third metal wiring line layer 23 and a fourth light blocking film 74 (74-3) formed from fourth metal wiring lines 34 of a fourth metal wiring line layer 24 to each other by contact plugs 54 and 55, respectively, such that the three light blocking films are used as a single wiring line.

While, in the description above, three light blocking films are used as a single wiring line, the number of such light blocking films may be one or a plural number. Only it is necessary to adopt a configuration that a light blocking layer in an upper layer and another light blocking layer in a lower layer are formed in a partly overlapping relationship with each other.

In this manner, two or more wiring lines in one light blocking film group 70 can be formed from a light blocking film.

A wiring line as which at least one of the first to fourth light blocking films 71 to 74 is used also for electric connection is, for example, a power supply line. As an example, a circuit diagram of a CMOS image sensor is shown in FIG. 12.

Figure 12:
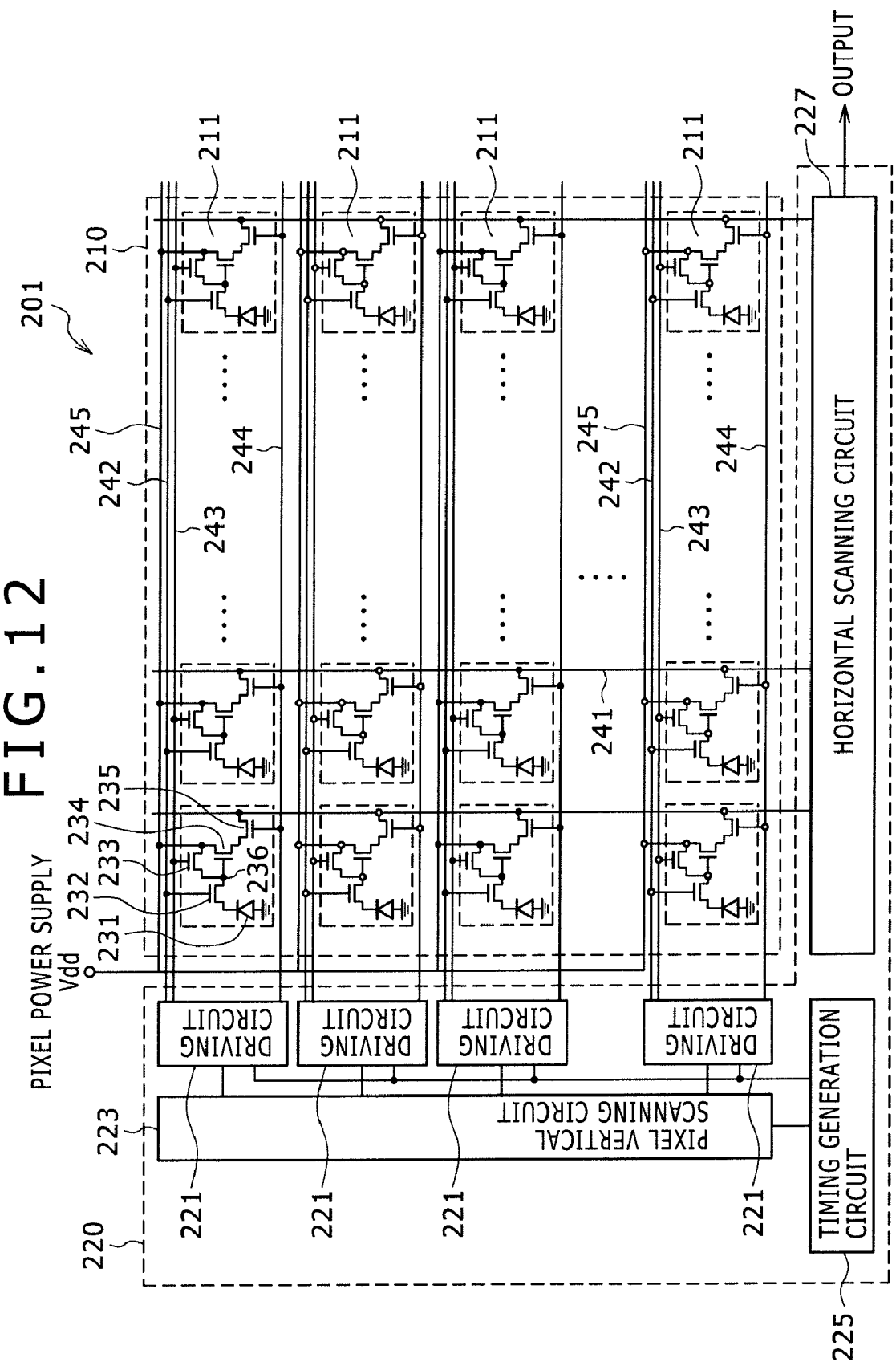
FIG. 12 is a circuit diagram showing an example of a CMOS image sensor.

Referring to FIG. 12, the CMOS image sensor 201 as a solid-state image pickup device includes a pixel section 210 wherein a plurality of pixels 211 each including a photoelectric conversion element are disposed two-dimensionally in a matrix, and a logic section 220 as a peripheral circuit to the pixel section 210. The logic section 220 includes a driving circuit 221, a pixel vertical scanning circuit 223, a timing generation circuit 225 and a horizontal scanning circuit 227 for driving control signal lines independently of each other.

For the matrix arrangement of the pixels 211, output signal lines 241 are wired for individual columns, and control signal lines are wired for individual rows of the pixels 211. The control signal lines may include, for example, transfer control lines 242, reset control lines 243 and selection control lines 244. Further, a reset line 245 for supplying a reset voltage to each of the pixels 211.

An example of an internal configuration of the pixels 211 is shown. A unit pixel in the present circuit example is a pixel circuit which includes, for example, a photodiode as a photoelectric conversion element in a light receiving section 231 and further includes four transistors including, for example, a transfer transistor 232, a reset transistor 233, an amplification transistor 234 and a selection transistor 235. Here, for example, an N-channel MOS transistor is used for the transfer transistor 232, reset transistor 233, amplification transistor 234 and selection transistor 235.

The transfer transistor 232 is connected between the cathode electrode of the photodiode of the light receiving section 231 and a floating diffusion portion 236 which is a charge voltage conversion portion. The transfer transistor 232 transfers signal charge, here electrons, photoelectrically converted by and accumulated in the light receiving section 231, to the floating diffusion portion 236.

The reset transistor 233 is connected at the drain electrode thereof to the reset line 245 and at the source electrode thereof to the floating diffusion portion 236. Prior to transfer of signal charge from the light receiving section 231 to the floating diffusion portion 236, a reset pulse is provided to the gate electrode of the reset transistor 233, and thereupon, the reset transistor 233 resets the potential of the floating diffusion portion 236 to a reset voltage.

The amplification transistor 234 is connected at the gate electrode thereof to the floating diffusion portion 236 and at the drain electrode thereof to a pixel power supply Vdd. The amplification transistor 234 outputs the potential of the floating diffusion portion 236 after reset by the reset transistor 233 as a reset level and outputs the potential of the floating diffusion portion 236 after signal potential is transferred by the transfer transistor 232 as a signal level.

The selection transistor 235 is connected, for example, at the drain thereof to the source of the amplification transistor 234 and at the source electrode thereof to the output signal line 241. Then, when a selection pulse is applied to the gate voltage of the selection transistor 235, the selection transistor 235 enters an on state to place the pixel 211 into a selected state to output a signal outputted from the amplification transistor 234 to the output signal line 241. It is to be noted that the selection transistor 235 may be configured otherwise such that it is connected between the pixel power supply Vdd and the drain electrode of the amplification transistor 234.

The driving circuit 221 carries out a reading out operation of reading out a signal of the pixels 211 of a reading out row of the pixel section 210.

The pixel vertical scanning circuit 223 is formed from a shift register, an address decoder or the like. The pixel vertical scanning circuit 223 suitably generates a reset pulse, a transfer pulse, a selection pulse and so forth to scan the pixels 211 of the pixel section 210 in a vertical direction, that is, in an upward and downward direction, in a unit of a row regarding an electronic shutter row and a reading out row and carries out an electronic shutter operation for carrying out signal sweeping out of the pixels 211 in the electronic shutter row. Then, the pixel vertical scanning circuit 223 carries out an electronic shutter operation for the same row (electronic shutter row) prior by an interval of time corresponding to the shutter speed to reading out scanning by the driving circuit 221.

The horizontal scanning circuit 227 is formed from a shift register, an address decoder or the like and horizontally scans the pixel columns of the pixel section 210 in order.

The timing generation circuit 225 produces timing signals and controls signals used for reference to operation of the driving circuit 221, pixel vertical scanning circuit 223 and so forth.

The configuration of the solid-state image pickup device (CMOS image sensor) 201 as a solid-state image pickup device is an example, and the solid-state image pickup device 201 may have a different configuration.

In such a CMOS image sensor as described above, it is possible to use a light blocking film, for example, for some of the reset lines 245 connected to the pixel power supply Vdd for supplying a reset voltage or as a shunt wiring line. Also some of the transfer control lines 242, reset control lines 243, selection control lines 244, wiring lines for connecting the pixel section 210 and the logic section 220 and so forth may be formed from a light blocking film.

Since some of wiring lines can be used also as a light blocking film in this manner, it is possible to lay out wiring lines in a formation region of a light blocking film in which wiring lines are not disposed, and the degree of freedom in wiring line layout is enhanced. Therefore, such effects as reduction of the cell area, reduction of the wiring line resistance and so forth can be achieved.

Now, the film thickness required for the light blocking film in a case wherein a metal wiring line of the multilayer wiring line section 14 in the embodiments described hereinabove serves also as a light blocking film is described.

Usually, in order for a solid-state image pickup device to provide a contrast also in an environment in which the luminous intensity is high, the black level reference pixel section 13 is demanded to sufficiently attenuate the light irrespective of the luminous density.

The sunlight indicates such a high luminous intensity under a natural environment that it is higher than approximately 100,000 lx (lux) although it depends upon the place, and a case wherein the luminous intensity is attenuated to 0.1 lx or less is examined.

The light blocking property is represented by reflection on the surface of a substance and absorption in the substance. For example, where the transmittance of incident light to a material film is represented by T, the reflection factor of the incident light by R, the absorption coefficient of the incident light by α, and the film thickness of the material film by d, the following expression (1) is obtained:

$$T=(1-R)\exp(-\alpha d) \quad (1)$$

Here, where the transmittance of the material film with the film thickness $d_1$ is represented by $T_1$ and the transmittance of the material film with the film thickness $d_2$ is represented by $T_2$, $T_1$ and $T_2$ can be represented as given by the following expression (2) from the expression (1) above:

$$\log(T_1/T_2)=-\alpha(d_1-d_2) \quad (2)$$

where the absorption coefficient α can be represented as given by the following expression (3) using an extinction coefficient K:

$$\alpha=(4\pi/\lambda)K \quad (3)$$

Therefore, the transmittance T, the film thickness d of the material thickness and the extinction coefficient K have such a relationship as given by the following expression (4):

$$\log(T_1/T_2)=-(4\pi/\lambda)K(d_1-d_2) \quad (4)$$

In short, where the axis of ordinate is represented by the logarithm of the transmittance T and the axis of abscissa is represented by the film thickness d of the light blocking film, it is indicated that, as the inclination of the curve increases, the extinction coefficient K increases, that is, the light blocking property increases.

Since the light blocking properties of different material films can be compared readily with each other if they are represented as graphs taking the logarithm of the transmittance T as the axis of abscissa as described above, all transmittances are indicated in dB through dB conversion thereof. The dB conversion expression in this instance is given below:

$$dB=20 \log T \quad (5)$$

Figure 13:
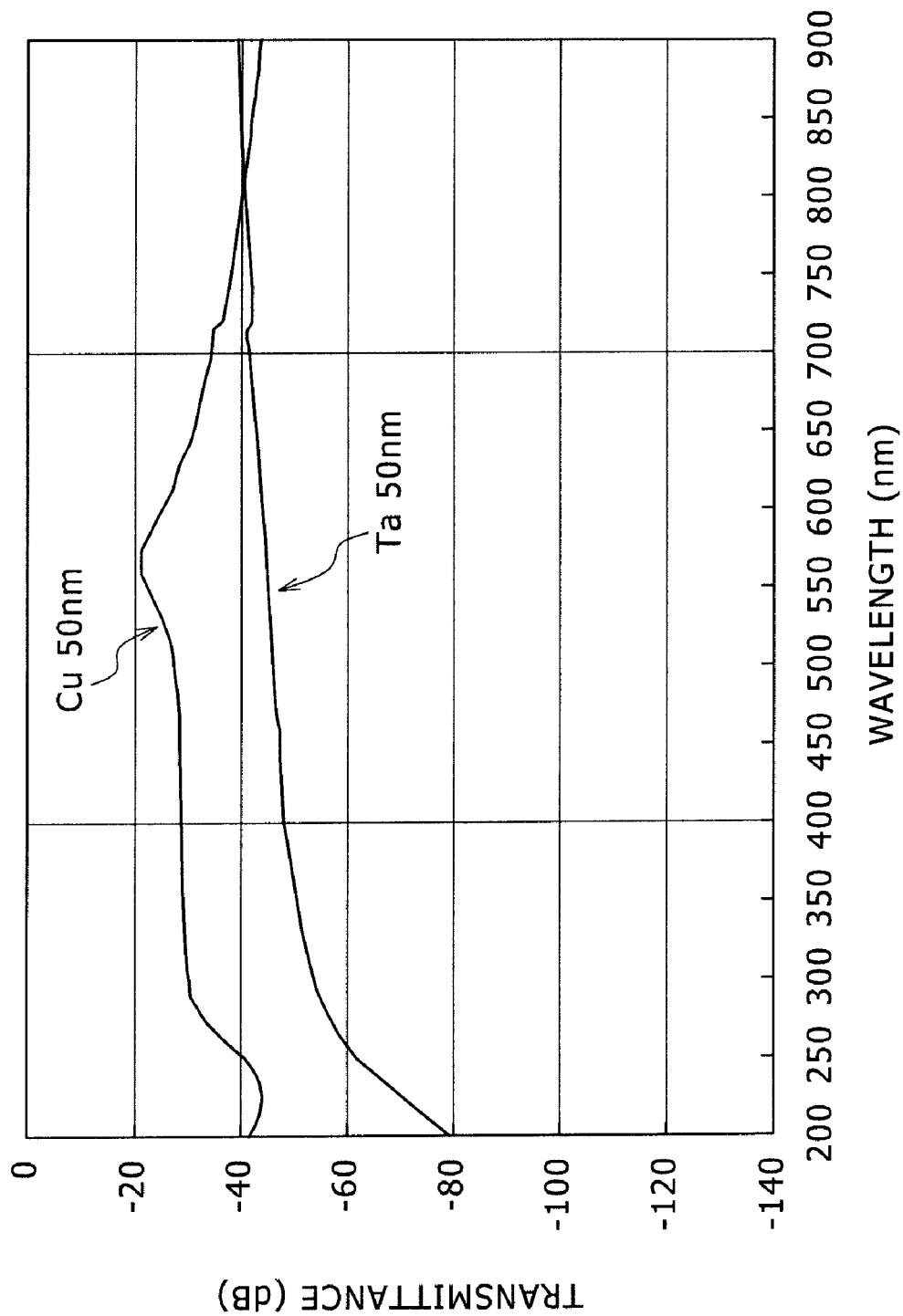
FIG. 13 is a diagram illustrating actual measurement data of the wavelength dependency of the transmittance in the visible light range.

A relationship between the transmittance of copper and tantalum in the visible light range and the wavelength of incident light is indicated by actual measurement data of the waveform dependency of the transmittance in the visible light range of FIG. 13.

Figure 14:
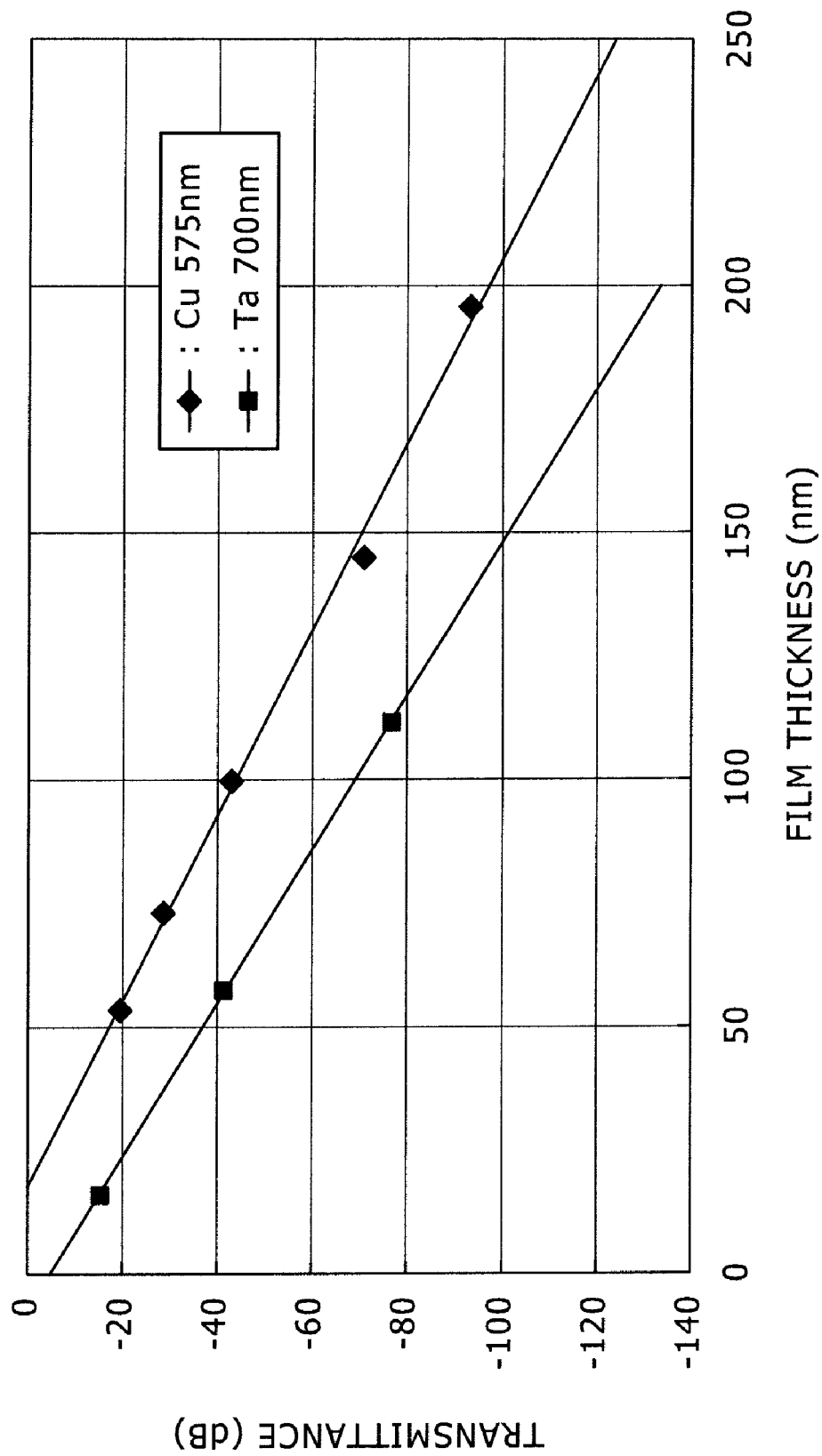
FIG. 14 is a diagram illustrating actual measurement data of the film thickness dependency of the transmittance at wavelengths which are likely to be transmitted.
Figure 15:
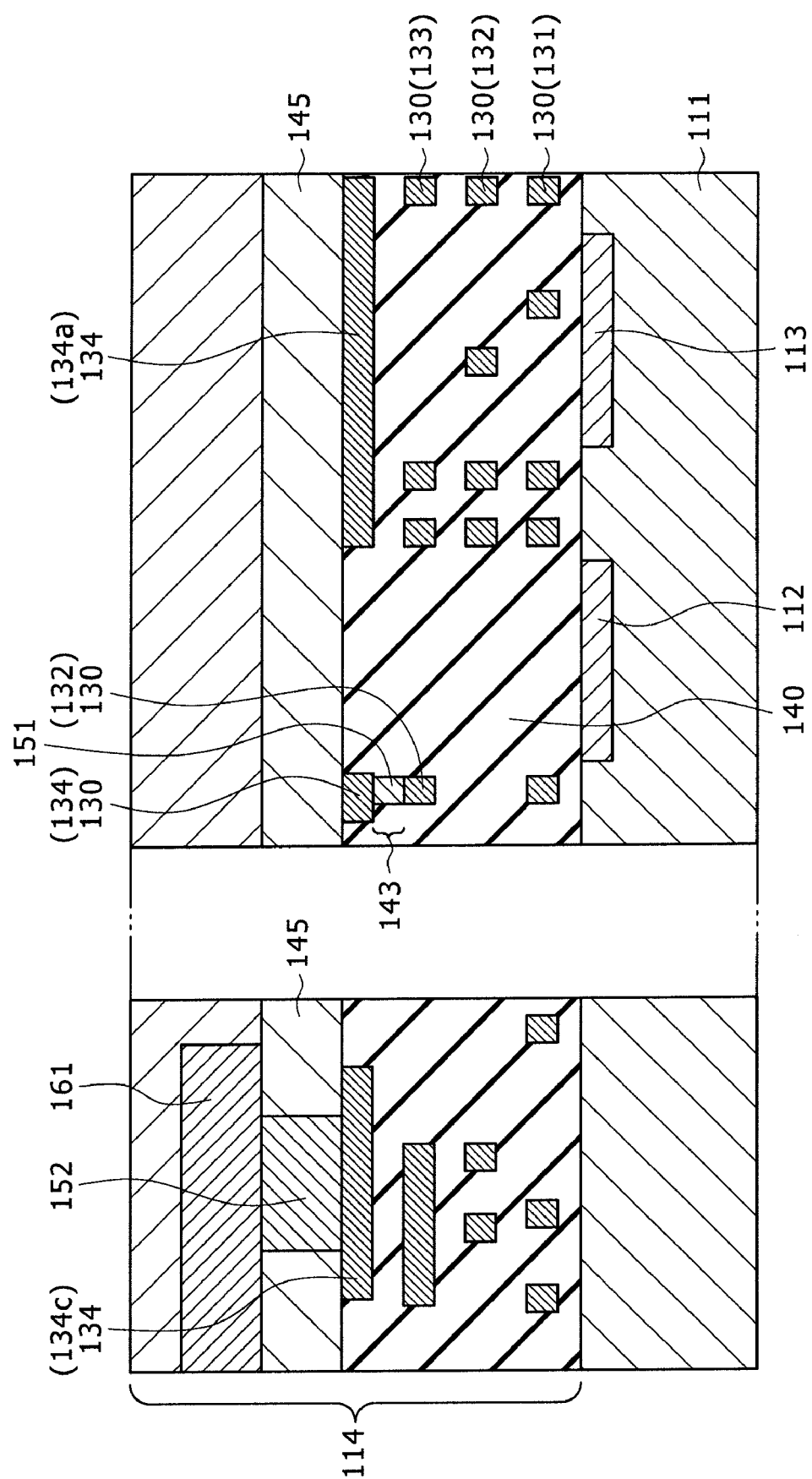
FIG. 15 is a schematic sectional view showing a general configuration showing an example of a solid-stage image pickup device in related art.
Figure 16A:
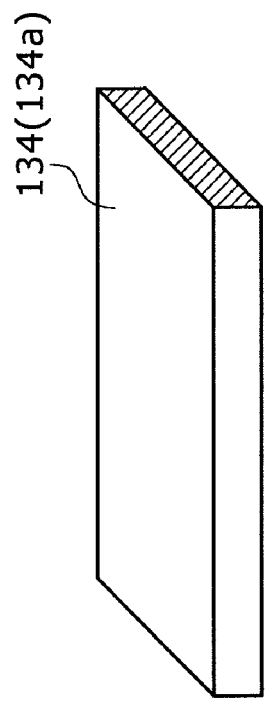
FIGS. 16A and 16B illustrate a perspective view and a schematic sectional view of part of a light blocking film.
Figure 16B:
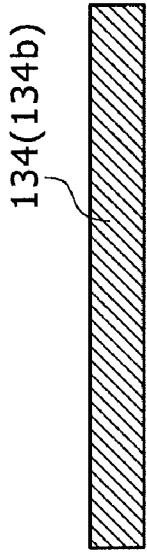

Meanwhile, a relationship between the transmittance of copper and tantalum at a wavelength which is likely to be transmitted in the visible light range is indicated by actual measurement data of the film thickness dependency of the transmittance at the wavelength which is likely to be transmitted in FIG. 14.

In order to attenuate the intensity of light from 100,000 lx (lux) to 0.1 lx (lux), a light blocking property of more than −120 dB is required. For example, where tantalum is used for the barrier metal of a copper wiring line and the film thickness of the copper wiring line is set to 15 nm, in order to achieve a light blocking performance of −120 dB, a film thickness of 216 nm is required for the copper wiring line.

Accordingly, where the film thickness of a copper wiring line per one layer is smaller than 216 nm, it is effective to apply the embodiments of the present invention described hereinabove.

Now, a fabrication method of a first solid-state image pickup device to which the present invention is applied is described with reference to FIG. 1.

First, a light receiving pixel section 12 and a black level reference pixel section 13 each formed from a photodiode are formed on a semiconductor substrate 11, and a multilayer wiring line section 14 is formed on an upper face of the light receiving pixel section 12 and the black level reference pixel section 13 by an ordinary fabrication method for a solid-stage image pickup device.

The multilayer wiring line section 14 is formed by forming an interlayer insulating film 40 and metal wiring line layers 20 (for example, a first metal wiring line layer 21, a second metal wiring line layer 22, a third metal wiring line layer 23 and a fourth metal wiring line layer 24) alternately in order from the semiconductor substrate 11 side. Further, as occasion demands, contact plugs extending through the interlayer insulating film 40 between the metal wiring line layers 20 are formed. For example, in the interlayer insulating film 40 (44) between a metal wiring line layer 20 (fourth metal wiring line layer 24) and another metal wiring line layer 20 in the lower layer (third metal wiring line layer 23), a contact plug 51 is formed which extends through the interlayer insulating film 44 to connect the fourth metal wiring line 34 of the fourth metal wiring line layer 24 and the third metal wiring line 33 of the third metal wiring line layer 23 to each other. Naturally, though not shown, also between metal wiring lines in different metal wiring line layers, contact plugs are formed.

The metal wiring line layers 20 are formed from metal wiring lines of copper (Cu), aluminum (Al), tungsten (W) or the like which are used, for example, as a wiring material of a semiconductor device. Meanwhile, the interlayer insulating film 40 is formed, for example, from a silicon dioxide ($SiO_2$) film. The interlayer insulating film 40 may be formed from any material which isolates the metal wiring lines from each other, and an inorganic insulating film, an organic insulating film or the like having a light transmitting property can be used.

When a plurality of first metal wiring lines 31 are formed in the first metal wiring line layer 21, some of the first metal wiring lines 31 are disposed in a spaced relationship from each other and in a plurality of rows above the black level reference pixel section 13 to form the first light blocking film 71.

Further, when a plurality of second metal wiring lines 32 are formed from the second metal wiring line layer 22 on the first metal wiring line layer 21, some of the second metal wiring lines 32 are disposed between and above the first metal wiring lines 31 above the black level reference pixel section 13 to form the second light blocking film 72.

Furthermore, when a plurality of third metal wiring lines 33 are formed from the third metal wiring line layer 23 on the second metal wiring line layer 22, some of the third metal wiring lines 33 are disposed in a predetermined spaced relationship from each other and in a plurality of rows in a direction perpendicular to the second light blocking film 72 above the black level reference pixel section 13 to form the third light blocking film 73.

Further, when a plurality of fourth metal wiring lines 34 are formed from the fourth metal wiring line layer 24 on the third metal wiring line layer 23, some of the fourth metal wiring lines 34 are disposed between and above the third metal wiring line 33 above the black level reference pixel section 13 to form the fourth light blocking film 74.

Thereafter, an interlayer insulating film 45 is formed in such a manner as to cover over an upper face of that one of the metal wiring line layers 20 (fourth metal wiring line layer 24) which is positioned at the uppermost position, and a connection hole extending to the fourth metal wiring line 34-5 of the fourth metal wiring line layer 24 is formed in the interlayer insulating film 45. Then, a contact plug 55 is formed, for example, from aluminum (Al) in the connection hole such that it connects to the fourth metal wiring line 34-5. Further, the contact plug 55 is joined to an upper face of the interlayer insulating film 45, and a pad 61 for electric connection to a peripheral circuit or the like not shown is formed, for example, from aluminum (Al). The pad 61 and the contact plug 55 may be formed in the same layer.

While, in the foregoing description, the metal wiring line layers 20 formed in four layers are described as an example, the metal wiring line layers 20 may be formed in more than four layers, and in this instance, the first light blocking film 71, second light blocking film 72, third light blocking film 73 and fourth light blocking film 74 may be formed using four successive ones of the more than four metal wiring line layers 20.

Further, where the metal wiring line layers 20 are formed in more than six layers, light blocking films similar to the first light blocking film 71 and the second light blocking film 72 may be formed in a perpendicular relationship to the third light blocking film 73 and the fourth light blocking film 74. Further, where the metal wiring line layers 20 are formed in more than eight layers, two or more sets of the first to fourth light blocking films 71 to 74 can be formed. In other words, light blocking layers can be formed in response to the number of metal wiring line layers.

Further, such a configuration of the first solid-state image pickup device according to the second embodiment as described hereinabove may be formed. In this instance, the width and the pattern distance of the patterns of the light blocking films should be changed.

The fabrication method is advantageous in that, even if the thickness of wiring lines is reduced together with refinement, the light blocking property of light blocking films formed from films in the same layers as the wiring lines can be maintained or enhanced and light blocking films having a light blocking property ready for LSIs in the future generations can be formed. Further, the light blocking property against oblique incident light can be enhanced.

Furthermore, even if chemical-mechanical polishing is used to form light blocking films in order to form the light blocking films with a line width with which dishing or erosion does not occur, since the film thickness of the light blocking films can be assured to a film thickness as designed, deterioration of the light blocking property can be prevented.

Now, a fabrication method of a second solid-state image pickup device to which the present invention is applied is described with reference to FIG. 7.

First, a light receiving pixel section 12 and a black level reference pixel section 13 each formed from a photodiode are formed on a semiconductor substrate 11, and a multilayer wiring line section 14 is formed on an upper face of the light receiving pixel section 12 and the black level reference pixel section 13 by an ordinary fabrication method for a solid-stage image pickup device.

The multilayer wiring line section 14 is formed, for example, by forming an interlayer insulating film 40 and metal wiring line layers 20 (for example, a first metal wiring line layer 21, a second metal wiring line layer 22, a third metal wiring line layer 23 and a fourth metal wiring line layer 24) alternately in order from the semiconductor substrate 11 side. Further, as occasion demands, contact plugs extending through the interlayer insulating film 40 between the metal wiring line layers 20 are formed. For example, in the interlayer insulating film 40 (44) between a metal wiring line layer 20 (fourth metal wiring line layer 24) and another metal wiring line layer 20 in the lower layer (third metal wiring line layer 23), a contact plug 51 is formed which extends through the interlayer insulating film 44 to connect the fourth metal wiring line 34 of the fourth metal wiring line layer 24 and the third metal wiring line 33 of the third metal wiring line layer 23 to each other. Naturally, though not shown, also between metal wiring lines in different metal wiring line layers, contact plugs are formed.

The metal wiring line layers 20 are formed from metal wiring lines of copper (Cu), aluminum (Al), tungsten (W) or the like which are used, for example, as a wiring material of a semiconductor device. Meanwhile, the interlayer insulating film 40 is formed, for example, from a silicon dioxide ($SiO_2$) film. The interlayer insulating film 40 may be formed from any material which isolates the metal wiring lines from each other, and an inorganic insulating film, an organic insulating film or the like having a light transmitting property can be used.

When a plurality of first metal wiring lines 31 are formed in the first metal wiring line layer 21, some of the first metal wiring lines 31 are disposed in a spaced relationship from each other and in a plurality of rows above the black level reference pixel section 13 to form the first light blocking film 71.

Further, when a plurality of second metal wiring lines 32 are formed from the second metal wiring line layer 22 on the first metal wiring line layer 21, some of the second metal wiring lines 32 are disposed between and above the first metal wiring lines 31 above the black level reference pixel section 13 to form the second light blocking film 72.

Further, when a plurality of third metal wiring lines 33 are formed from the third metal wiring line layer 23 on the second metal wiring line layer 22, some of the third metal wiring lines 33 are disposed between and above the second metal wiring lines 32 above the black level reference pixel section 13 to form the third light blocking film 73.

Furthermore, when a plurality of fourth metal wiring lines 34 are formed from the fourth metal wiring line layer 24 on the third metal wiring line layer 23, some of the fourth metal wiring lines 34 are disposed between and above the third metal wiring line 33 above the black level reference pixel section 13 to form the fourth light blocking film 74.

Thereafter, an interlayer insulating film 45 is formed in such a manner as to cover over an upper face of that one of the metal wiring line layers 20 (fourth metal wiring line layer 24) which is positioned at the uppermost position, and a connection hole extending to the fourth metal wiring line 34-5 of the fourth metal wiring line layer 24 is formed in the interlayer insulating film 45. Then, a contact plug 55 is formed, for example, from aluminum (Al) in the connection hole such that it connects to the fourth metal wiring line 34-5. Further, the contact plug 55 is joined to an upper face of the interlayer insulating film 45, and a pad 61 for electric connection to a peripheral circuit or the like not shown is formed, for example, from aluminum (Al). The pad 61 and the contact plug 55 may be formed in the same layer.

While, in the foregoing description, the metal wiring line layers 20 formed in four layers are described as an example, the metal wiring line layers 20 may be formed in more than four layers, and in this instance, the first light blocking film 71, second light blocking film 72, third light blocking film 73 and fourth light blocking film 74 may be formed using four successive ones of the more than four metal wiring line layers 20.

Further, such a configuration of the second solid-state image pickup device 4 according to the fourth embodiment as described hereinabove may be formed. In this instance, the width and the pattern distance of the patterns of the light blocking films should be changed.

The fabrication method is advantageous in that, even if the thickness of wiring lines is reduced together with refinement, the light blocking property of light blocking films formed from films in the same layers as the wiring lines can be maintained or enhanced and light blocking films having a light blocking property ready for LSIs in the future generations can be formed. Further, the light blocking property against oblique incident light can be enhanced.

Furthermore, even if chemical-mechanical polishing is used to form light blocking films in order to form the light blocking films with a line width with which dishing or erosion does not occur, since the film thickness of the light blocking films can be assured to a film thickness as designed, deterioration of the light blocking property can be prevented.

It is to be noted that the examples of the structure of the embodiments 1 to 4 described hereinabove are mere examples and can be modified suitably with regard to the pattern shape, wiring line material and interlayer film material in the wiring line width satisfies a design rule determined for each semiconductor device and each generation.

Further, the solid-state image pickup device of the present invention can be applied to a solid-state image pickup device incorporated in various electronic apparatus. For example, the solid-state image pickup device of the present invention can be applied to a digital camera, a digital video camera, a digital camera of a portable terminal, an automatic teller machine (ATM), a personal computer, an authentication apparatus of a fingerprint, a vein, the face or the like of various security apparatus and so forth. The solid-state image pickup device of the present invention is useful particularly for a slim type solid-state image pickup device.

While preferred embodiments of the present invention have been described using specific terms, such description is for illustrative purposes only, and it is to be understood that changes and variations may be made without departing from the spirit or scope of the following claims.

What is claimed is:

1. A solid-state image pickup device, comprising:
a light receiving pixel section formed on a semiconductor substrate;
a black level reference pixel section formed on said semiconductor substrate;

a multi-layer wiring line section formed on said semiconductor substrate including said light receiving pixel section and said black level reference pixel section;
said multi-layer wiring line section including,
an insulating layer formed on said semiconductor substrate; and
a plurality of metal wiring line layers formed in said insulating layer and including first, second, third and fourth metal wiring line layers;
a first light blocking film formed by disposing some of a plurality of first metal wiring lines formed from said first metal wiring line layer in a predetermined spaced relationship from each other and in a plurality of rows above said black level reference pixel section;
a second light blocking film formed by disposing some of a plurality of second metal wiring lines formed from said second metal wiring line layer above said first metal wiring line layer between and above said first metal wiring lines above said black level reference pixel section;
a third light blocking film formed by disposing some of a plurality of third metal wiring lines formed from said third metal wiring line layer above said second metal wiring line layer in a predetermined spaced relationship from each other and in a plurality of rows in a direction perpendicular to said second light blocking film above said black level reference pixel section; and
a fourth light blocking layer formed by disposing some of a plurality of fourth metal wiring lines formed from said fourth metal wiring line layer above said third metal wiring line layer above and between said third metal wiring lines above said black level reference pixel section.

2. The solid-state image pickup device according to claim 1, wherein said second light blocking film is formed in an overlapping relationship with and above part of said first light blocking film.

3. The solid-state image pickup device according to claim 1, wherein said fourth light blocking film is formed in an overlapping relationship with and above part of said third light blocking film.

4. The solid-state image pickup device according to claim 1, wherein at least one of said first to fourth light blocking films is used as a wiring line for use for electric connection.

5. A solid-state image pickup device, comprising:
a light receiving pixel section formed on a semiconductor substrate;
a black level reference pixel section formed on said semiconductor substrate;
a multi-layer wiring line section formed on said semiconductor substrate including said light receiving pixel section and said black level reference pixel section;
said multi-layer wiring line section including,
an insulating layer formed on said semiconductor substrate; and
a plurality of metal wiring line layers formed in said insulating layer and including first and second metal wiring line layers;
a first light blocking film formed by disposing some of a plurality of first metal wiring lines formed from said first metal wiring line layer in a predetermined spaced relationship from each other and in a plurality of rows above said black level reference pixel section; and
a second light blocking film formed by disposing some of a plurality of second metal wiring lines formed from said second metal wiring line layer above said first metal wiring line layer in a region including a region between and above said first metal wiring lines above said black level reference pixel section;
a set of said first and second light blocking films being provided in a plurality of layers above said black level reference pixel section.

6. The solid-state image pickup device according to claim 1, wherein said first and second light blocking films are formed in a partly overlapping relationship with each other on a layout in plan.

7. The solid-state image pickup device according to claim 1, wherein at least one of said first and second light blocking films is used as a wiring line for use for electric connection.

* * * * *